US012772678B2

(12) United States Patent
Yang et al.

(10) Patent No.: US 12,772,678 B2
(45) Date of Patent: Oct. 20, 2026

(54) DISPLAY APPARATUS HAVING A PAD PROTECTIVE LAYER DISPOSED ON A PAD METAL LAYER

(71) Applicant: Samsung Display Co., Ltd., Yongin-Si (KR)

(72) Inventors: Shinhyuk Yang, Yongin-si (KR); Donghan Kang, Yongin-si (KR); Yujin Kim, Yongin-si (KR); Jeehoon Kim, Yongin-si (KR); Junki Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 768 days.

(21) Appl. No.: 17/951,977

(22) Filed: Sep. 23, 2022

(65) Prior Publication Data

US 2023/0209926 A1 Jun. 29, 2023

(30) Foreign Application Priority Data

Dec. 27, 2021 (KR) ........................ 10-2021-0188865

(51) Int. Cl.
*H10K 59/131* (2023.01)
*H10K 59/12* (2023.01)
(Continued)

(52) U.S. Cl.
CPC ........... *H10K 59/131* (2023.02); *H10K 71/00* (2023.02); *H10K 59/1201* (2023.02);
(Continued)

(58) Field of Classification Search
CPC ... H01L 2224/0345; H01L 2224/03614; H01L 2224/0381; H01L 2224/05016;
(Continued)

(56) References Cited

U.S. PATENT DOCUMENTS 7,468,527 B2 12/2008 Ahn
7,795,808 B2 9/2010 Matsuura et al.
(Continued)

FOREIGN PATENT DOCUMENTS

CN 113964112 A * 1/2022 ........... H10H 20/857
JP 5117001 B2 1/2013
(Continued)

OTHER PUBLICATIONS

In re Aller, 42 C.C.P.A. 824 ; 220 F.2d 454 (C.C.P.A 1955).

*Primary Examiner* — Wael M Fahmy
*Assistant Examiner* — Tiberiu Dan Onuta
(74) *Attorney, Agent, or Firm* — Innovation Counsel LLP

(57) ABSTRACT

A display apparatus is disclosed that includes a substrate, a display element, a transistor, and a pad. The substrate includes a display area and a peripheral area. The display element is disposed on the display area. The transistor is electrically connected to the display element. The pad is disposed on the peripheral area and having a multilayered structure. The pad includes a pad metal layer, a first pad protective layer disposed on the pad metal layer, and a second pad protective layer interposed between the pad metal layer and the first pad protective layer. The second pad protective layer includes a different material from the first pad protective layer. The transistor includes a semiconductor layer disposed on the substrate, a gate electrode disposed on a gate insulating layer that covers the semiconductor layer, and a connection electrode arranged on an interlayer insulating layer covering the gate electrode. The connection electrode has the same multilayered structure as the multilayered structure of the pad, and the connection electrode is connected to the semiconductor layer.

16 Claims, 18 Drawing Sheets

(51) Int. Cl.

| | |
|---|---|
| ***H10K 71/00*** | (2023.01) |
| ***H10W 72/00*** | (2026.01) |
| ***H10W 72/90*** | (2026.01) |

(52) U.S. Cl.

CPC *H10W 72/01938* (2026.01); *H10W 72/01953* (2026.01); *H10W 72/01971* (2026.01); *H10W 72/90* (2026.01); *H10W 72/923* (2026.01); *H10W 72/934* (2026.01); *H10W 72/9415* (2026.01); *H10W 72/942* (2026.01); *H10W 72/952* (2026.01); *H10W 72/953* (2026.01)

(58) Field of Classification Search

CPC . H01L 2224/05027; H01L 2224/05083; H01L 2224/05147; H01L 2224/05166; H01L 2224/0518; H01L 2224/05184; H01L 2224/05187; H01L 2224/05188; H01L 2224/05557; H01L 2224/05562; H01L 2224/05571; H01L 2224/05573; H01L 2224/05686; H01L 24/05; H01L 2924/0543; H01L 2924/0549; H01L 2924/0542; H10K 59/131; H10K 59/1201; H10K 59/123; H10K 59/124; H10K 71/00; H10K 50/844; H10K 50/841

See application file for complete search history.

(56) References Cited

U.S. PATENT DOCUMENTS

| | | | | |
|---|---|---|---|---|
| 8,319,221 | B2 | 11/2012 | Choi et al. | |
| 9,570,528 | B2 | 2/2017 | You et al. | |
| 10,381,418 | B2 | 8/2019 | Kim et al. | |
| 10,784,203 | B2 * | 9/2020 | Huang | H10W 70/095 |
| 10,920,326 | B2 | 2/2021 | Sasaki et al. | |
| 2005/0245066 | A1 * | 11/2005 | Mis | H10W 72/012 438/618 |
| 2014/0353644 | A1 * | 12/2014 | You | H10K 59/873 257/40 |
| 2018/0013397 | A1 * | 1/2018 | Lim | H03H 9/171 |
| 2021/0343811 | A1 * | 11/2021 | Kim | H10K 59/124 |
| 2021/0375792 | A1 * | 12/2021 | Sax | H01L 24/05 |
| 2021/0398889 | A1 * | 12/2021 | Takatsuka | H01L 23/49816 |
| 2022/0328394 | A1 * | 10/2022 | Chang | H01L 24/04 |

FOREIGN PATENT DOCUMENTS

| | | | |
|---|---|---|---|
| KR | 1020140141444 | A | 12/2014 |
| KR | 10-1716471 | B1 | 3/2017 |
| KR | 10-2017-0096367 | A | 8/2017 |
| KR | 1020180025382 | A | 3/2018 |
| KR | 10-2019-0133749 | A | 12/2019 |

* cited by examiner

DISPLAY APPARATUS HAVING A PAD PROTECTIVE LAYER DISPOSED ON A PAD METAL LAYER

CROSS-REFERENCE TO RELATED APPLICATION

This application is based on and claims priority under 35 U.S.C. § 119 to Korean Patent Application No. 10-2021-0188865, filed on Dec. 27, 2021, in the Korean Intellectual Property Office, the disclosure of which is incorporated by reference herein in its entirety.

BACKGROUND

1. Field

The present disclosure relates to a display apparatus and a method of manufacturing the same, and more particularly, to a display apparatus of which the occurrence of defects during the manufacture is reduced, and a method of manufacturing the display apparatus.

2. Description of the Related Art

A display apparatus displays an image by receiving information regarding an image, etc. To receive the information regarding the image, etc., pad electrodes electrically connected to display elements are arranged at edges of the display apparatus. Such pad electrodes are electrically connected to pad electrodes of a printed circuit board or bumps of an integrated circuit.

SUMMARY

However, an existing display apparatus may have some problems such as damage to pad electrodes in a subsequent process performed after pad electrodes are formed. The present disclosure is to solve several problems including the aforementioned one and provides a display apparatus of which the occurrence of defects during the manufacture of the display apparatus is reduced. However, the technical goals are merely examples, and the scope of the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a substrate including a display area and a peripheral area outside the display area, a display element disposed on the display area, a transistor electrically connected to the display element, and a pad disposed on the peripheral area and having a multilayered structure, wherein the pad includes a pad metal layer, a first pad protective layer disposed on the pad metal layer, and a second pad protective layer interposed between the pad metal layer and the first pad protective layer and including a different material from the first pad protective layer, and the transistor includes a semiconductor layer disposed on the substrate, a gate electrode disposed on a gate insulating layer that covers the semiconductor layer, and a connection electrode disposed on an interlayer insulating layer covering the gate electrode, having the same multilayered structure as the multilayered structure of the pad, and connected to the semiconductor layer.

The connection electrode may include a connection metal layer, a first connection protective layer disposed on the connection metal layer, and a second connection protective layer interposed between the connection metal layer and the first connection protective layer and including a different material from the first connection protective layer.

The connection metal layer may include a same material as the pad metal layer, the first connection protective layer may include a same material as the first pad protective layer, and the second connection protective layer may include a same material as the second pad protective layer.

The first pad protective layer may include transparent conductive oxide, and the second pad protective layer may include metal.

The first pad protective layer may include indium tin oxide (ITO), indium zinc oxide (IZO), zinc oxide (ZnO), indium oxide ($In_2O_3$), indium gallium oxide (IGO), or aluminum zinc oxide (AZO), and the second pad protective layer may include titanium (Ti), molybdenum (Mo), or tungsten (W).

The first pad protective layer or the second pad protective layer may include a tip protruding further than the pad metal layer in a lateral direction.

A length of the tip may be less than about 0.1 μm with respect to one side of the pad metal layer.

The display apparatus may further include a pad auxiliary layer disposed under the pad metal layer.

The pad auxiliary layer may include a pad auxiliary layer tip protruding further than the pad metal layer in a lateral direction.

A length of the pad auxiliary layer tip may be less than about 0.2 μm with respect to one side of the pad metal layer.

A tilt angle of a side surface of the pad metal layer may range from about 20 degrees to about 70 degrees.

A tilt angle of a side surface of the second pad protective layer may range from about 50 degrees to about 100 degrees.

The display apparatus may further include an inorganic insulating layer covering an edge of the pad and including a first hole overlapping the pad.

The first pad protective layer may include a first pad portion overlapping the inorganic insulating layer, and a second pad portion overlapping the first hole of the inorganic insulating layer, and a thickness of the first pad portion may be greater than a thickness of the second pad portion.

The display apparatus may further include an organic insulating layer disposed on the inorganic insulating layer and including a second hole overlapping the first hole of the inorganic insulating layer, wherein the second pad portion may include a 2-1 pad portion relatively close to the first pad portion and a 2-2 pad portion that is relatively further from the first portion than the 2-1 pad portion, and a thickness of the 2-1 pad portion may be greater than a thickness of the 2-2 pad portion.

The connection electrode may include a connection metal layer, a first connection protective layer disposed on the connection metal layer, and a second connection protective layer interposed between the connection metal layer and the first connection protective layer and including a different material from the first connection protective layer, wherein the inorganic insulating layer may cover the connection electrode and may include a third hole overlapping the connection electrode, the first connection protective layer may further include a first connection portion overlapping the inorganic insulating layer and a second connection portion overlapping the third hole, a thickness of the first connection portion may be greater than a thickness of the second connection portion, and the thickness of the second connection portion may be greater than a thickness of the 2-2 pad portion.

The pad may further include a first metal oxide layer interposed between the pad metal layer and the second pad protective layer and including a same metal element as metal in the pad metal layer. The pad may further include a second metal oxide layer interposed between the second pad protective layer and the first pad protective layer and including a same metal element as metal in the second pad protective layer.

According to one or more embodiments, a method of manufacturing a display apparatus, includes forming a pad metal layer forming layer on a substrate in a first chamber; forming a second pad protective layer forming layer on the pad metal layer forming layer in the first chamber; cleaning the substrate with deionized water; forming a first pad protective layer forming layer on the second pad protective layer forming layer in a second chamber that is different from the first chamber, and patterning the pad metal layer forming layer, the second pad protective layer forming layer, and the first pad protective layer forming layer.

The method may further include forming a connection metal layer forming layer on the substrate, forming a second connection protective layer forming layer on the connection metal layer forming layer, and forming a first connection protective layer forming layer on the second connection protective layer forming layer, wherein the forming of the pad metal layer forming layer may include the forming of the connection metal layer forming layer, the forming of the second pad protective layer forming layer may include the forming of the second connection protective layer forming layer, and the forming of the first pad protective layer forming layer may include the forming of the first connection protective layer forming layer.

The first pad protective layer forming layer may include ITO, IZO, ZnO, $In_2O_3$, IGO, or AZO, and the second pad protective layer forming layer may include Ti, Mo, or W.

Other aspects, features, and advantages other than those described above will become apparent from the following detailed description, claims and drawings for carrying out the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
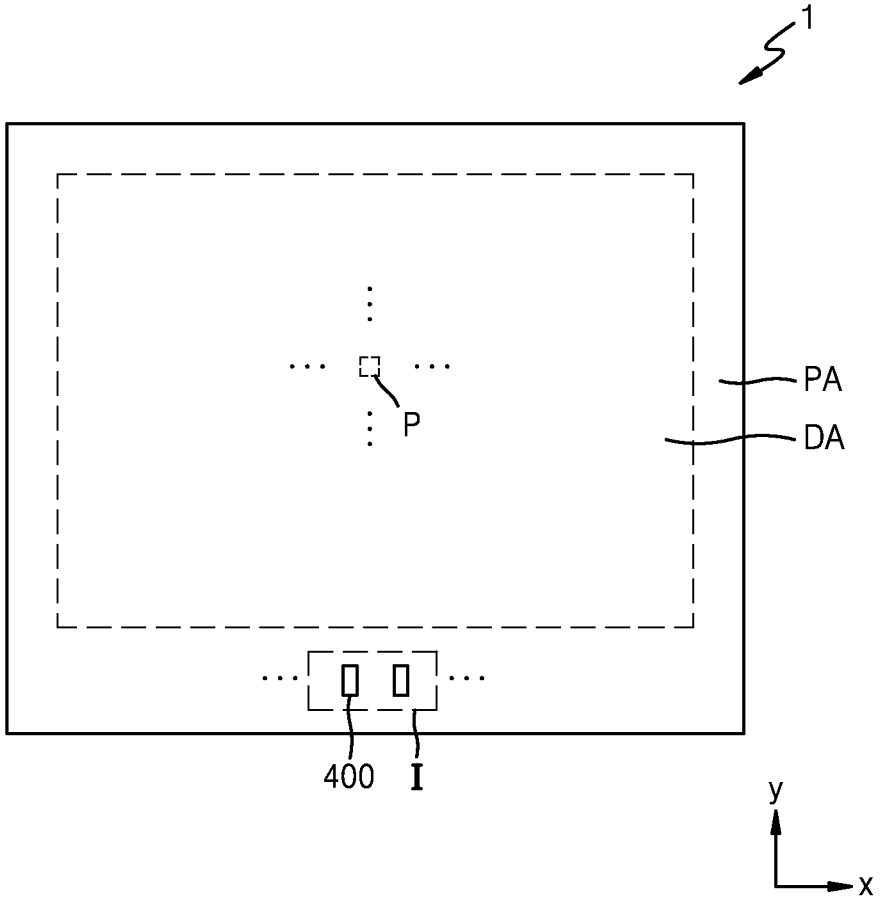
FIG. 1 is a schematic plan view of a portion of a display apparatus, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As the disclosure allows for various changes and numerous embodiments, particular embodiments will be illustrated in the drawings and described in detail in the written description. The attached drawings for illustrating embodiments of the present disclosure are referred to in order to gain a sufficient understanding of the present disclosure, the merits thereof, and the objectives accomplished by the implementation of the present disclosure. The disclosure may, however, be embodied in many different forms and should not be construed as being limited to the embodiments set forth herein.

Hereinafter, the present disclosure will be described in detail by explaining embodiments of the disclosure with reference to the attached drawings. Like reference numerals in the drawings denote like elements.

It will be understood that when a component, such as a layer, a film, a region, or a plate, is referred to as being "on" another component, the component can be directly on the other component or intervening components may be present thereon. Sizes of elements in the drawings may be exaggerated for convenience of explanation. In other words, since sizes and thicknesses of elements in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

It will be understood that although the terms "first," "second," etc. may be used herein to describe various components, these components should not be limited by these terms.

As used herein, the singular forms "a," "an," and "the" are intended to include the plural forms as well, unless the context clearly indicates otherwise.

It will be further understood that the terms "comprises," "comprising," "includes," and "including" used herein specify the presence of stated features or components, but do not preclude the presence or addition of one or more other features or components.

As used herein, the word "or" means logical "or" so, unless the context indicates otherwise, the expression "A, B, or C" means "A and B and C," "A and B but not C," "A and C but not B," "B and C but not A," "A but not B and not C," "B but not A and not C," and "C but not A and not B."

It will be understood that when a layer, region, or component is referred to as being connected to another layer, region, or component, it can be directly or indirectly connected to the other layer, region, or component. That is, for example, intervening layers, regions, or components may be present. It will be understood that when a layer, region, or component is referred to as being electrically connected to another layer, region, or component, it can be electrically and directly or indirectly connected to the other layer, region, or component. That is, for example, intervening layers, regions, or components may be present.

FIG. 1 is a schematic plan view of a portion of a display apparatus 1, according to an embodiment. As illustrated in FIG. 1, the display apparatus 1 may include a display area DA, where a plurality of pixels P are arranged, and a peripheral area PA arranged outside the display area DA. In detail, the peripheral area PA may entirely surround the display area DA.

Each pixel P of the display apparatus 1 is an area where light of a certain color is emitted, and the display apparatus 1 may provide an image by using light emitted from the pixels P. For example, each pixel P may emit red light, green light, or blue light.

The display area DA may have various shapes such as a polygon including a rectangle, as illustrated in FIG. 1. For example, the display area DA may have a rectangular shape of which a horizontal length is greater than a vertical length or a horizontal length is less than a vertical length, or may have a square shape. Alternatively, the display area DA may have various shapes such as an oval shape or a circular shape.

The peripheral area PA may be a non-display area where no pixels are arranged. In the peripheral area PA, a driver, etc. for providing signals or power to the pixels P may be arranged. A plurality of pads 400, which are regions to which an electronic device, a printed circuit board, or the like may be electrically connected, may be disposed on the peripheral area PA. The pads 400 may be arranged apart from each other on the peripheral area PA and may be electrically connected to a printed circuit board or an integrated circuit device.

Figure 2:
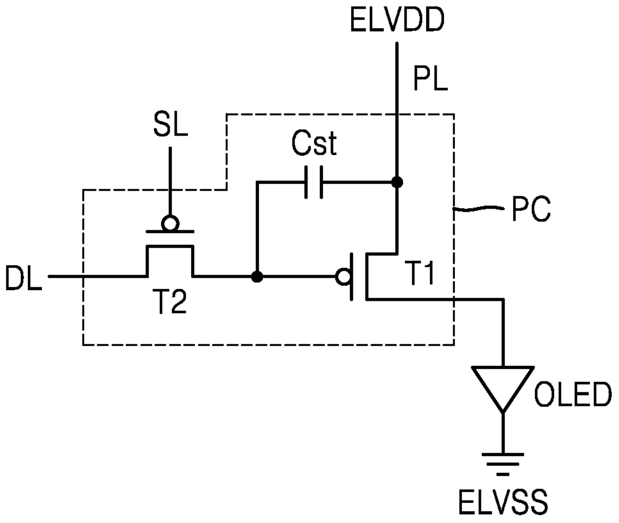
FIG. 2 is an equivalent circuit diagram of one pixel included in a display apparatus, according to an embodiment.

FIG. 2 is an equivalent circuit diagram of a pixel P included in the display apparatus 1, according to an embodiment. As illustrated in FIG. 2, the pixel P may include a pixel circuit PC and an organic light-emitting diode OLED electrically connected thereto.

The pixel circuit PC may include a first transistor T1, a second transistor T2, and a storage capacitor Cst. The second transistor T2 may be a switching transistor, may be connected to a scan line SL and a data line DL, and may be configured to transmit, to the first transistor T1, a data voltage that is input from the data line DL according to a switching voltage input through the scan line SL. The storage capacitor Cst may be connected between the second transistor T2 and a driving power line PL and may be configured to store a voltage corresponding to a difference between a voltage transmitted from the second transistor T2 and a first power voltage ELVDD provided to the driving power line PL.

The first transistor T1 may be a driving transistor, may be connected to the driving power line PL and the storage capacitor Cst, and may control a driving current flowing in the organic light-emitting diode OLED from the driving power line PL according to the voltage stored in the storage capacitor Cst. The organic light-emitting diode OLED may emit light having certain brightness according to the driving current. An opposite electrode (530, see FIG. 4) of the organic light-emitting diode OLED may be configured to receive a second power voltage ELVSS.

FIG. 2 illustrates that the pixel circuit PC includes two transistors and one storage capacitor, but one or more embodiments are not limited thereto. For example, the number of transistors or the number of storage capacitors may vary according to a design of the pixel circuit PC.

Figure 3:
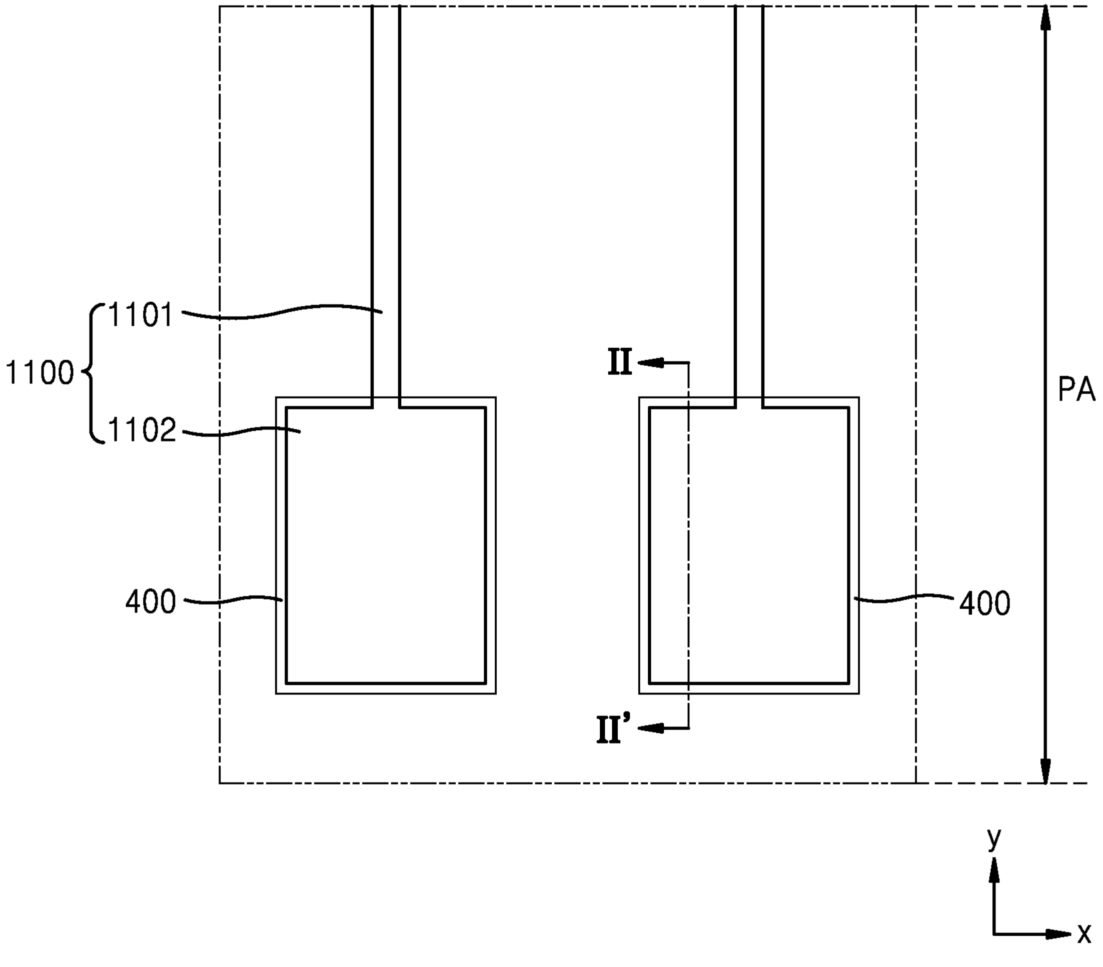
FIG. 3 is a plan view illustrating an enlarged region I of FIG. 1.

FIG. 3 is a plan view illustrating an enlarged region I of FIG. 1. As illustrated in FIG. 3, connection wires 1100 may be disposed on the peripheral area PA. The connection wires 1100 may electrically connect signal lines disposed on the display area DA, for example, data lines (or scan lines), to the pads 400. Each connection wire 1100 may include a first portion 1101, which extends in a direction to electrically connect the signal line to the pad 400, and a second portion 1102, which is arranged at an end portion of the first portion 1101.

The pad 400 may overlap the connection wire 1100. In detail, the pad 400 may overlap the second portion 1102 of the connection wire 1100. The pad 400 may have a multi-layered structure including a plurality of sub-layers, which is described below.

Figure 4:
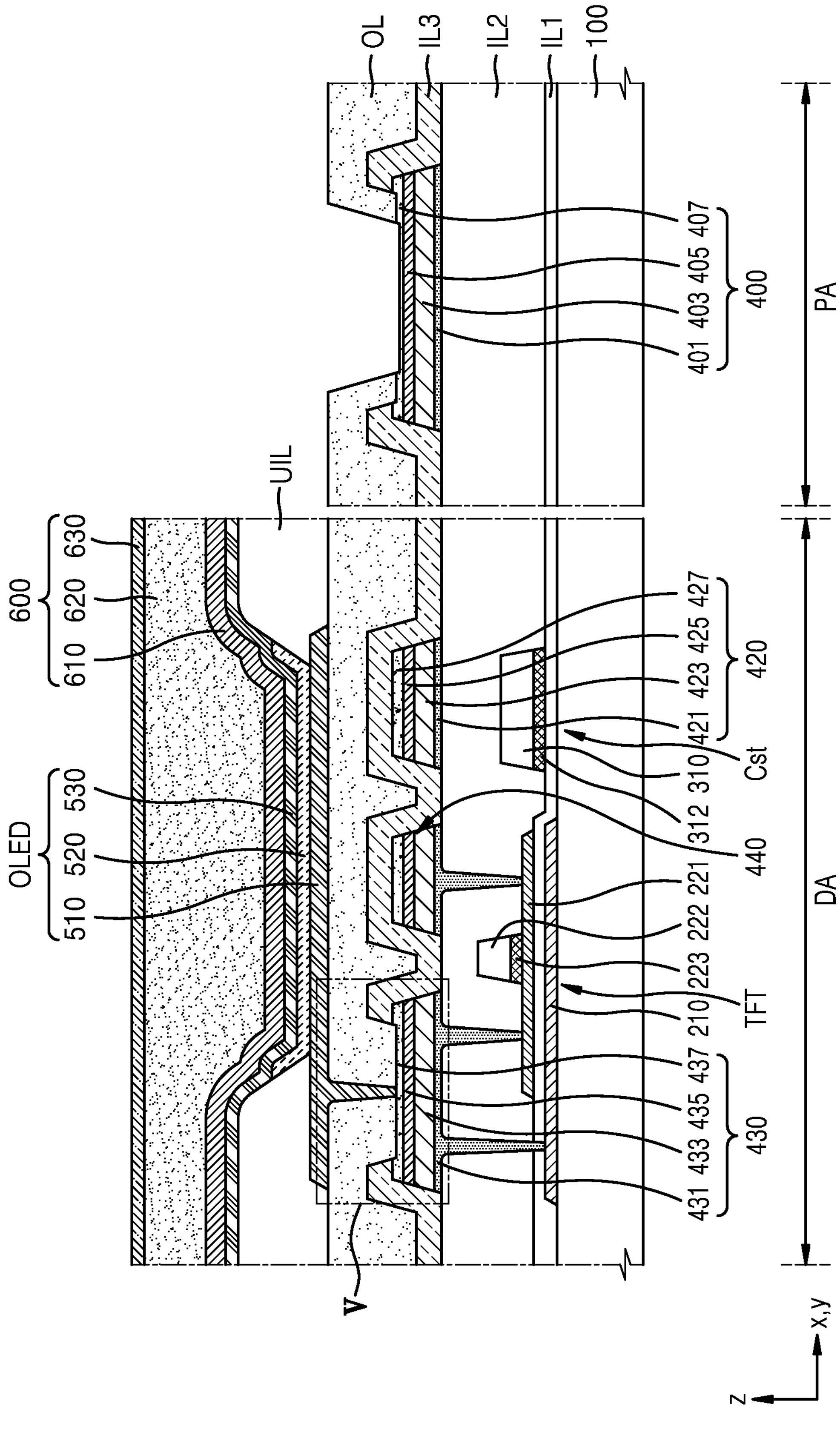
FIG. 4 is a schematic cross-sectional view of a portion of a display apparatus, according to an embodiment.

FIG. 4 is a schematic cross-sectional view of a portion of the display apparatus 1, according to an embodiment.

As illustrated in FIG. 4, the display apparatus 1 includes a substrate 100. The substrate 100 may include various materials that are flexible or bendable. For example, the substrate 100 may include glass, metal, or polymer resin. Also, the substrate 100 may include polymer resin such as polyethersulphone, polyacrylate, polyetherimide, polyethylene naphthalate, polyethylene terephthalate, polyethylene terephthalate, polyphenylene sulfide, polyarylate, polyimide, polycarbonate, or cellulose acetate propionate. Various modifications may be made to the substrate 100. For example, the substrate 100 may have a multilayered structure including two layers including the above polymer resin and a barrier layer including an inorganic material (silicon oxide, silicon nitride, silicon oxynitride, or the like) and interposed between the two layers.

On the substrate 100, a display element and a transistor TFT electrically connected thereto may be disposed. FIG. 4 illustrates that the organic light-emitting diode OLED is disposed above the substrate 100 as a display element. The description that the organic light-emitting diode OLED is electrically connected to the transistor TFT may indicate that the pixel electrode (510, see FIG. 4) is electrically connected to the transistor TFT.

The transistor TFT may include a semiconductor layer 221, which includes amorphous silicon, polycrystalline silicon, an organic semiconductor material, or an oxide semiconductor material, a gate electrode 222, a first connection electrode 430, and a second connection electrode 440. For example, the first connection electrode 430 may be a source electrode, and the second connection electrode 440 may be a drain electrode. Alternatively, according to the polarity of the transistor TFT, the first connection electrode 430 may be a drain electrode, and the second connection electrode 440 may be a source electrode. The gate electrode 222 may include various conductive materials and have various layer structures, for example, a structure including a molybdenum (Mo) layer and an aluminum (Al) layer. Alternatively, the gate electrode 222 may include a titanium nitride (TiNx) layer, an Al layer, or a titanium (Ti) layer. The first connection electrode 430 and the second connection electrode 440 may also include various conductive materials and have various layer structures, for example, a structure including a Ti layer, an Al layer, or a copper (Cu) layer.

To insulate the semiconductor layer 221 from the gate electrode 222, a gate insulating layer 223 including an inorganic material such as silicon oxide, silicon nitride, or silicon oxynitride may be interposed between the semiconductor layer 221 and the gate electrode 222. In addition, a second insulating layer IL2 including an inorganic material such as silicon oxide, silicon nitride, or silicon oxynitride may be disposed on the gate electrode 222, and the first connection electrode 430 and the second connection electrode 440 may be disposed on the second insulating layer IL2. The first connection electrode 430 and the second connection electrode 440 may have multilayered structures including sub-layers, which is described below.

However, one or more embodiments are not limited thereto. For example, the transistor TFT may include any one of the first connection electrode 430 and the second connection electrode 440 or may not include the first connection electrode 430 and the second connection electrode 440. For example, the transistor TFT may not include the second connection electrode 440, and another transistor TFT connected to the above-described transistor TFT may not include the first connection electrode 430, and semiconductor layers 221 of the two transistors may be connected to each other. Such a connection structure may have the same effect as the effect achieved when one transistor includes the first connection electrode 430 and the other transistor includes the second connection electrode 440, and the first connection electrode 430 of one transistor is connected to the second connection electrode 440 of the other transistor.

An insulating layer including the inorganic material may be formed through Chemical Vapor Deposition (CVD) or Atomic Layer Deposition (ALD), which is the same in embodiments below and modified examples thereof.

The storage capacitor Cst may include a first electrode 310 and a second electrode 420. The first electrode 310 of the storage capacitor Cst may be formed through the same process as the gate electrode 222 and may include the same material as the gate electrode 222. An insulating layer 312 including the same material as the gate insulating layer 223 may be disposed under the first electrode 310. Because the insulating layer 312 under the first electrode 310 is formed together through the same mask process as the first electrode 310, a planar shape of the insulating layer 312 may be substantially the same as a planar shape of the first electrode 310.

The first connection electrode 430 and the second connection electrode 440 of the transistor TFT and the second electrode 420 of the storage capacitor Cst may be formed together during a patterning process for forming the pad 400. Therefore, the first connection electrode 430, the second connection electrode 440, and the second electrode 420 may have a multilayered structure, similarly to the pad 400. Such a multilayered structure is described below in detail.

The transistor TFT may include a lower metal layer 210 disposed under the semiconductor layer 221, and the lower metal layer 210 may be electrically connected to one of the first and second connection electrodes 430 and 440. In an embodiment, FIG. 4 illustrates that the lower metal layer 210 is electrically connected to the first connection electrode 430, and the lower metal layer 210 may be a sort of a lower first connection electrode.

The lower metal layer 210 may include Al, platinum (Pt), palladium (Pd), silver (Ag), magnesium (Mg), gold (Au), nickel (Ni), neodymium (Nd), iridium (Ir), chromium (Cr), lithium (Li), calcium (Ca), Mo, or Cu. The lower metal layer 210 may improve characteristics of the transistor TFT.

A first insulating layer IL1 may be disposed on the lower metal layer 210. In detail, the first insulating layer IL1 may be entirely formed on the substrate 100 to cover the lower metal layer 210. The first insulating layer IL1 may be disposed under the storage capacitor Cst and the pad 400. The first insulating layer IL1 may include, for example, inorganic materials such as silicon oxide, silicon nitride, or silicon oxynitride. The first insulating layer IL1 may improve the smoothness of an upper surface of the substrate 100 or may prevent or reduce the penetration of impurities into the semiconductor layer 221 of the transistor TFT from the substrate 100, etc.

The second insulating layer IL2 may be disposed on the gate electrode 222. In detail, the second insulating layer IL2 may be entirely formed on the substrate 100 to cover the gate electrode 222. Accordingly, the first connection electrode 430 and the second connection electrode 440 may be disposed on the second insulating layer IL2. The second insulating layer IL2 may cover the first electrode 310, and the second electrode 420 and the pad 400 may be disposed on the second insulating layer IL2. The second insulating layer IL2 may include, for example, inorganic materials such as silicon oxide, silicon nitride, or silicon oxynitride. Alternatively, the second insulating layer IL2 may include, for example, an organic material such as acryl, benzocyclobutene (BCB), or hexamethyldisiloxane (HMDSO). In this case, an upper surface of the second insulating layer IL2 (in a +z direction) may be planarized.

A third insulating layer IL3 may be disposed on the first connection electrode 430 and the second connection electrode 440. In detail, the third insulating layer IL3 may be entirely formed on the substrate 100 to cover the gate electrode 222. The third insulating layer IL3 may cover the second electrode 342 and the pad 400. The third insulating layer IL3 may include, for example, inorganic materials such as silicon oxide, silicon nitride, or silicon oxynitride.

An organic insulating layer OL may be disposed on the third insulating layer IL3. For example, as illustrated in FIG. 4, when the organic light-emitting diode OLED is disposed over the transistor TFT, the organic insulating layer OL may substantially planarize an upper portion of a protective layer covering the transistor TFT. The organic insulating layer OL may include, for example, an organic material such as acryl, BCB, or HMDSO. FIG. 4 illustrates that the organic insulating layer OL is a single layer, but may be multiple layers.

The display element may be disposed on the organic insulating layer OL of the substrate 100. The organic light-emitting diode OLED of FIG. 4 may be used as the display element. The organic light-emitting diode OLED may include, for example, the pixel electrode 510, the opposite electrode 530, and an intermediate layer 520 interposed therebetween. The intermediate layer may include an emission layer. As illustrated in FIG. 4, the pixel electrode 510 may contact any one of the first connection electrode 430 and the second connection electrode 440 through an opening formed in the organic insulating layer OL, etc., and may be electrically connected to the transistor TFT. The pixel electrode 510 includes a light-transmissive conductive layer including a light-transmissive conductive oxide such as indium tin oxide (ITO), indium oxide ($In_2O_3$), or indium zinc oxide (IZO) and a reflection layer including metal such as Al or Ag. For example, the pixel electrode 510 may have a three-layer structure of ITO/Ag/ITO.

The intermediate layer 520 of the organic light-emitting diode OLED may include a low-molecular-weight or high-molecular-weight material. When the intermediate layer 520 includes a low-molecular-weight material, the intermediate layer 520 may have a single-layer structure or a multilayered structure in which a Hole Injection Layer (HIL), a Hole Transport Layer (HTL), an Emission Layer (EML), an Electron Transport Layer (ETL), or an Electron Injection Layer (EIL) are stacked, and may include various organic materials such as copper phthalocyanine (CuPc), N'-Di (naphthalene-1-yl)-N,N'-diphenyl-benzidine (NPB), and tris-8-hydroxyquinoline aluminum ($Alq_3$). The above-listed layers may be formed through vacuum deposition.

When the intermediate layer 520 includes a high-molecular-weight material, the intermediate layer 520 may mostly have a structure including an HTL and an EML. In this case, the HTL includes PEDOT, and the EML may include a high-molecular-weight material such as a poly-phenylenevinylene (PPV)-based material or a polyfluorene-based material. The intermediate layer 520 may be formed according to a screen printing method, an inkjet printing method, a Laser-Induced Thermal Imaging (LITI) method, or the like.

However, the intermediate layer 520 is not limited thereto and may have various structures. The intermediate layer 520 may include a layer integrally formed over the pixel electrode 510 or a layer patterned corresponding to each pixel electrode 510.

The opposite electrode 530 is disposed on an upper portion of the display area DA, and as illustrated in FIG. 4, the opposite electrode 530 may be disposed to cover the display area DA. That is, the opposite electrode 530 may be integrally formed over a plurality of organic light-emitting diodes OLED and correspond to the pixel electrodes 510. The opposite electrode 530 may include a light-transmissive conductive layer including ITO, $In_2O_3$, or IZO and may include a semi-transmissive layer including metal such as Al or Ag. For example, the opposite electrode 530 may be a semi-transmissive layer including MgAg.

A pixel-defining layer UIL may be disposed on the organic insulating layer OL. The pixel-defining layer UIL defines pixels because the pixel-defining layer UIL includes an opening corresponding to each pixel, that is, an opening exposing at least a central portion of the pixel electrode 510. Also, as illustrated in FIG. 4, the pixel-defining layer UIL may increase a distance between an edge of the pixel electrode 510 and the opposite electrode 530 and thus may prevent arcs, etc. from being generated on the edge of the pixel electrode 510. The pixel-defining layer UIL may include, for example, an organic material such as polyimide or HMDSO.

Because the organic light-emitting diode OLED may be easily damaged by external moisture, oxygen, or the like, an encapsulation layer 600 may cover the organic light-emitting diode OLED to protect the same. The encapsulation layer 600 may cover the display area DA and extend to an outer side of the display area DA. As illustrated in FIG. 4, the encapsulation layer 600 may include a first inorganic encapsulation layer 610, an organic encapsulation layer 620, and a second inorganic encapsulation layer 630.

The first inorganic encapsulation layer 610 may cover the opposite electrode 530 and include silicon oxide, silicon nitride, or silicon oxynitride. According to necessity, other layers such as a capping layer may be interposed between the first inorganic encapsulation layer 610 and the opposite electrode 530. Because the first inorganic encapsulation layer 610 is formed along a structure thereunder, an upper surface of the first inorganic encapsulation layer 610 may not be planar as illustrated in FIG. 4. The organic encapsulation layer 620 may cover the first inorganic encapsulation layer 610 and may have a substantially planar upper surface unlike the first inorganic encapsulation layer 610. In detail, the upper surface of the organic encapsulation layer 620 may be substantially planar in a portion corresponding to the display area DA. The organic encapsulation layer 620 may include at least one material selected from the group consisting of polyethylene terephthalate, polyethylene naphthalate, polycarbonate, polyimide, polyethylene sulfonate, polyoxymethylene, polyarylate, and hexamethyldisiloxane. The second inorganic encapsulation layer 630 may cover the organic encapsulation layer 620 and may include silicon oxide, silicon nitride, or silicon oxynitride. The second inorganic encapsulation layer 630 may contact the first inorganic encapsulation layer 610 on an edge of the second inorganic encapsulation layer 630 disposed on the outer side of the display area DA and thus may prevent the organic encapsulation layer 620 from being exposed to the outside.

Because the encapsulation layer 600 includes the first inorganic encapsulation layer 610, the organic encapsulation layer 620, and the second inorganic encapsulation layer 630, and although cracks may appear in the encapsulation layer 600 because of the multilayered structure thereof, such cracks may not continue between the first inorganic encapsulation layer 610 and the organic encapsulation layer 620 or between the organic encapsulation layer 620 and the second inorganic encapsulation layer 630. Thus, the generation of a path, through which external moisture, oxygen, or the like, penetrate the display area DA, may be prevented or reduced.

The pad 400 may be disposed on the peripheral area PA. As described above, as the pad 400 overlaps the connection wire 1100, the pad 400 may be electrically connected to the signal lines disposed on the display area DA through the connection wire 1100. The pad 400 may have a multilayered structure including sub-layers. For example, the pad 400 may include a pad metal layer 403, a pad auxiliary layer 401 disposed under the pad metal layer 403, a first pad protective layer 407 disposed on the pad metal layer 403, and a second pad protective layer 405 interposed between the pad metal layer 403 and the first pad protective layer 407. The pad 400 is described below in detail.

Figure 5:
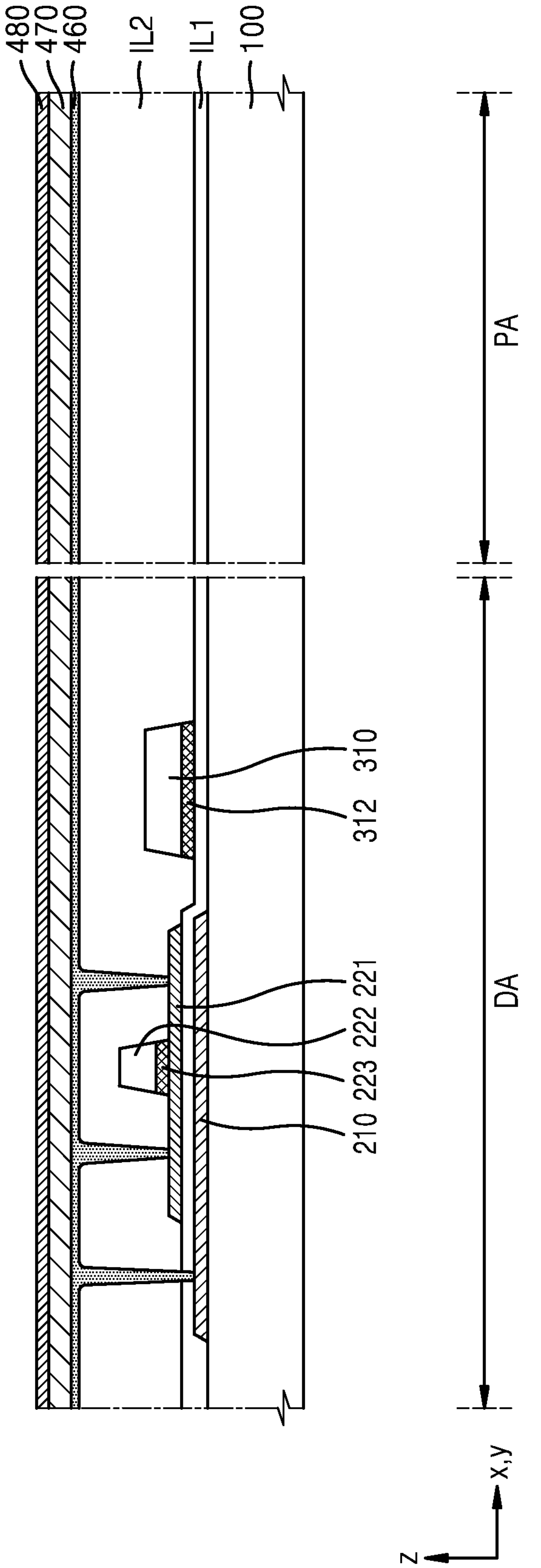
FIGS. 5, 6, and 7 are schematic cross-sectional views of processes of manufacturing a portion of the display apparatus of FIG. 4.
Figure 6:
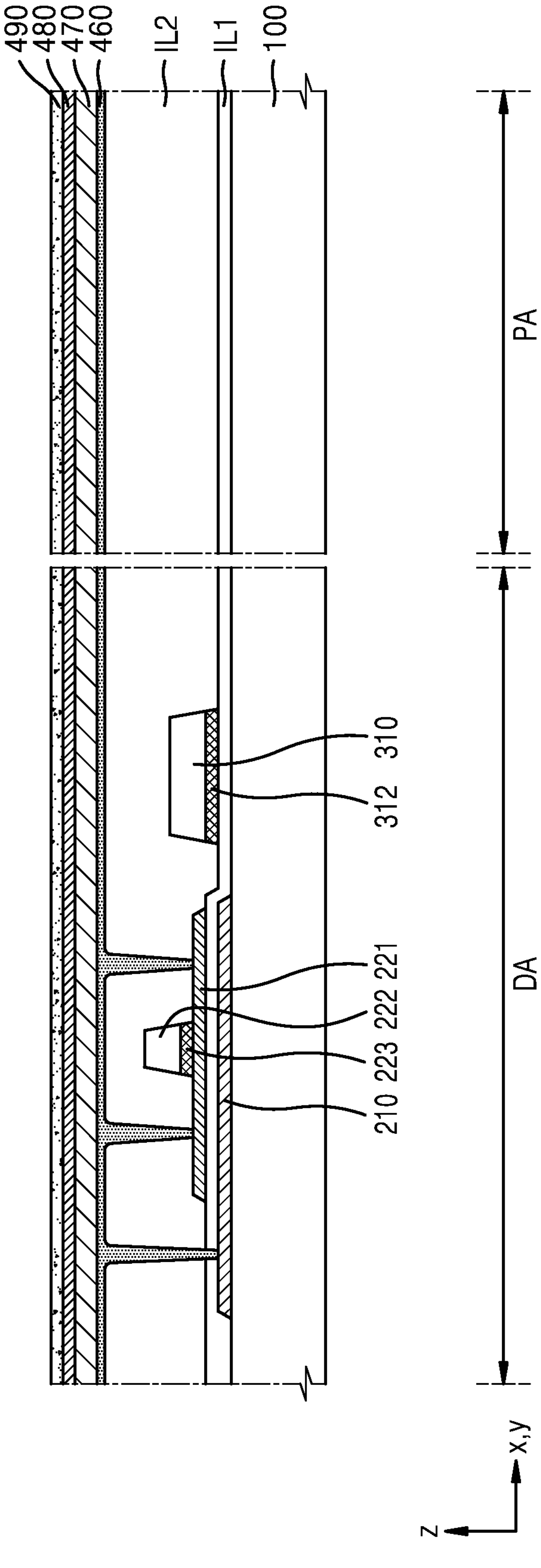
Figure 7:
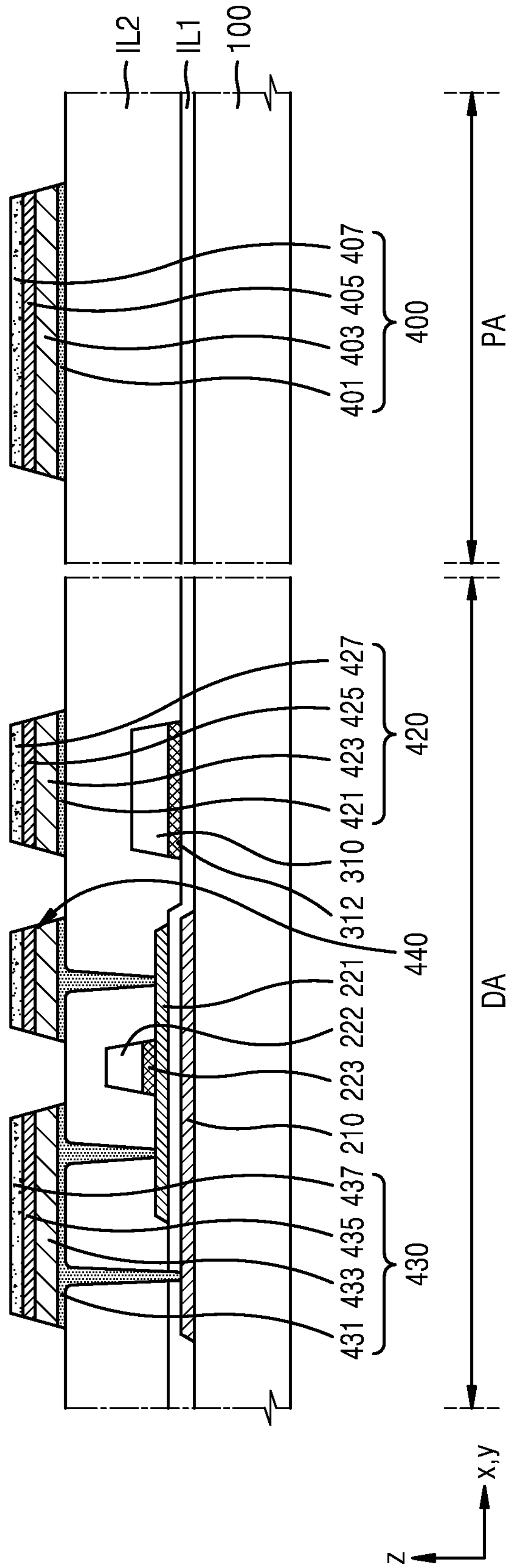

FIGS. 5 to 7 are schematic cross-sectional views of processes of manufacturing a portion of the display apparatus 1 of FIG. 4. In detail, FIGS. 5 to 7 are schematic cross-sectional views of a process of manufacturing the first connection electrode 430, the second connection electrode 440, the second electrode 420, and the pad 400 of the display apparatus of FIG. 4.

First of all, as illustrated in FIG. 5, a pad auxiliary layer forming layer 460 may be formed on an upper portion of the substrate 100, a pad metal layer forming layer 470 may be formed on the pad auxiliary layer forming layer 460, and a second pad protective layer forming layer 480 may be formed on the pad metal layer forming layer 470. In the present specification, the term "pad auxiliary layer forming layer" indicates a layer to which a shape of the pad auxiliary layer 401 is not patterned after a pad auxiliary layer forming material is deposited, and the term "pad metal layer forming layer" indicates a layer to which a shape of the pad metal layer 403 is not patterned after a pad metal layer forming material is deposited, and the term "second pad protective layer forming layer" indicates a layer to which a shape of the second pad protective layer 405 is not patterned after a second pad protective layer forming material is deposited.

In detail, the pad auxiliary layer forming material, the pad metal layer forming material, and the second pad protective layer forming material may be continuously deposited. For example, as the pad auxiliary layer forming material is entirely deposited on the substrate 100 in a first chamber according to a sputtering method, etc., the pad auxiliary layer forming layer 460 may be formed on the upper portion of the substrate 100. Then, as the pad metal layer forming material is entirely deposited on the substrate 100 in the same chamber (e.g., the first chamber) according to the sputtering method, etc., the pad metal layer forming layer 470 may be formed on the pad auxiliary layer forming layer 460. Then, as the second pad protective layer forming material is entirely deposited on the substrate 100 in the same chamber (e.g., the first chamber), the second pad protective layer forming layer 480 may be formed on the pad metal layer 403. However, one or more embodiments are not limited thereto. For example, the pad auxiliary layer 401, the pad metal layer 403, and the second pad protective layer 405 may be respectively formed in different chambers.

The pad metal layer forming material may include Cu, and the pad auxiliary layer forming material and the second pad protective layer forming material may each include Ti. However, one or more embodiments are not limited thereto. For example, the pad metal layer forming material may include Al, Pt, Pd, Ag, Mg, Au, Ni, Nd, Ir, Cr, lithium (Li), calcium (Ca), or Mo, and the pad auxiliary layer forming material or the second pad protective layer forming material may each include Mo or tungsten (W). The pad metal layer forming layer 470 may include Cu, and the pad auxiliary layer forming layer 460 and the second pad protective forming layer 480 may each include Ti.

As illustrated in FIG. 6, a first pad protective layer forming layer 490 may be formed on the second pad protective layer forming layer 480. In the present specification, the term "first pad protective layer forming layer" indicates a layer to which the shape of the first pad protective layer 407 is not patterned after a first pad protective layer forming material is deposited. For example, as the first pad protective layer forming material is entirely deposited on the substrate 100 in a second chamber that is different from the first chamber according to the sputtering method, etc., the first pad protective layer forming layer 490 may be formed on the second pad protective layer forming layer 480. The first pad protective layer forming material may include ITO.

As described below, the pad metal layer 403 may have a thickness ranging from about 3000 Å to about 15000 Å, and the pad metal layer forming material has to be deposited at a thickness of about 3000 Å or greater. Because the pad metal layer forming material is deposited according to the sputtering method, etc. and while the pad metal layer forming material is deposited, a temperature inside the first chamber may increase. Accordingly, after the deposition of the pad metal layer forming material is completed, the temperature inside the first chamber may be considerably high. When the first pad protective layer forming layer 490 is formed with ITO according to the sputtering method, etc., ITO may be crystallized because of a high temperature inside the first chamber. Because it is not easy to etch the crystallized ITO, there may be a difficulty in an etching process of patterning the shape of the first pad protective layer 407. Thus, the first pad protective layer forming material may be deposited in the second chamber that is different from the first chamber.

To form the first pad protective layer forming layer 490 in the second chamber, the substrate 100 may be cleaned with deionized water (DI) between a process of depositing the pad auxiliary layer forming material, the pad metal layer forming material, and the second pad protective layer forming material and a process of depositing the first pad protective layer forming material. For example, the substrate 100 may be cleaned by free-falling the DI, spraying the DI by using a spray, or free-falling the DI and adding vibration thereto according to megasonic cleaning.

When the pad metal layer forming layer 470 includes Cu and the second pad protective layer forming layer 480 is not formed on the pad metal layer forming layer 470, the pad metal layer forming layer 470 may be exposed to the outside. Accordingly, Cu included in the pad metal layer forming layer 470 may be easily oxidized by the DI in a process of cleaning the substrate 100 with the DI. Therefore, the pad 400, which is finally formed, may not have electrical characteristics that are set in advance. To prevent the above problem, the substrate 100 has to be cleaned with an organic solvent, and thus, when the second pad protective layer forming layer 480 is not formed on the pad metal layer forming layer 470, manufacturing costs of a display apparatus may increase.

However, in the case of a method of manufacturing a display apparatus according to of the present embodiment, the second pad protective layer forming layer 480 is formed on the pad metal layer forming layer 470. Accordingly, because the pad metal layer forming layer 470 is not exposed to the outside, the substrate 100 may be cleaned with the DI. Therefore, the manufacturing costs of the display apparatus 1 may be reduced.

As illustrated in FIG. 7, the pad 400 including the pad auxiliary layer 401, the pad metal layer 403, the second pad protective layer 405, and the first pad protective layer 407 may be formed by patterning the pad auxiliary layer forming layer 460, the pad metal layer forming layer 470, the second pad protective layer forming layer 480, and the first pad protective layer forming layer 490. In the patterning process, the pad auxiliary layer forming layer 460, the pad metal layer forming layer 470, the second pad protective layer forming layer 480, and the first pad protective layer forming layer 490 may be patterned to form the first connection electrode 430 and the second connection electrode 440 of the transistor TFT and the second electrode 420 of the storage capacitor Cst together.

For example, the pad metal layer forming layer 470 may be a connection metal layer forming layer, the second pad protective layer forming layer 480 may be a second connection protective layer forming layer, and the first pad protective layer forming layer 490 may be a first connection protective layer forming layer Accordingly, the first connection electrode 430 may be formed together by patterning the pad auxiliary layer forming layer 460, the pad metal layer forming layer 470, the second pad protective forming layer 480, and the first pad protective layer forming layer 490.

Therefore, the first connection electrode 430 and the second connection electrode 440 of the transistor TFT and the second electrode 420 of the storage capacitor Cst may each have a multilayered structure, similar to the pad 400. Accordingly, sub-layers 421, 423, 425, and 427 of the second electrode 420, sub-layers 431, 433, 435, and 437 of the first connection electrode 430, and sub-layers of the second connection electrode 440 may include the same materials as the pad auxiliary layer 401, the pad metal layer 403, the second pad protective layer 405, and the first pad protective layer 407 that are sub-layers of the pad 400, respectively.

Figure 8:
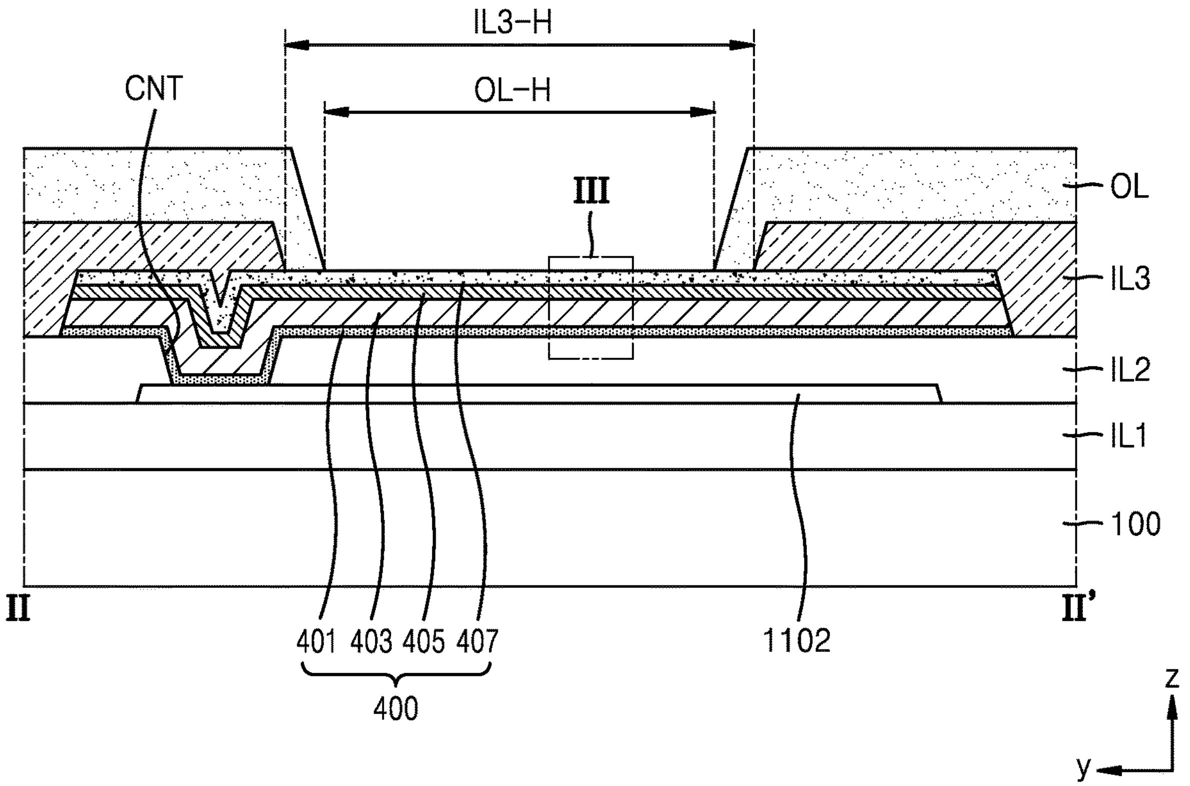
FIG. 8 is a cross-sectional view of a display apparatus taken along line II-II' of FIG. 3.
Figure 9:
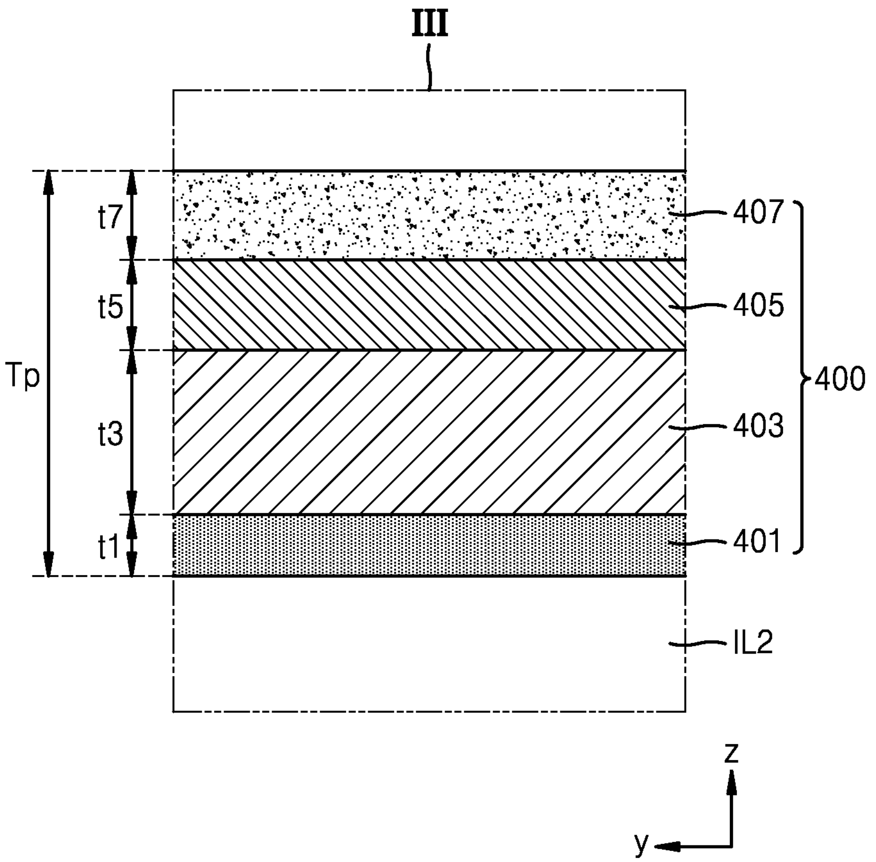
FIG. 9 is a cross-sectional view illustrating an enlarged portion III of FIG. 8.

FIG. 8 is a cross-sectional view of a pad of the display apparatus 1 according to an embodiment, taken along line II-II' of FIG. 3. FIG. 9 is a cross-sectional view of an enlarged region III of FIG. 8.

As illustrated in FIG. 8, the pad 400 may be disposed on the substrate 100, and before the pad 400 is formed, at least one insulating layer may be disposed on the substrate 100. In detail, the first insulating layer IL1 and the second insulating layer IL2 may be disposed on the substrate 100, and the pad 400 may be disposed on the first insulating layer IL1 and the second insulating layer IL2.

The pad 400 may have a multilayered structure including the sub-layers, as illustrated in FIGS. 8 and 9. For example, the pad 400 may include the pad metal layer 403, the pad auxiliary layer 401 disposed under the pad metal layer 403, the first pad protective layer 407 disposed on the pad metal layer 403, and the second pad protective layer 405 interposed between the pad metal layer 403 and the first pad protective layer 407.

The pad metal layer 403 may be a sub-layer occupying most of the pad 400. The description that the pad metal layer 403 occupies most of the pad 400 may indicate that a thickness t3 of the pad metal layer 403 is equal to or greater than about 50% of the total thickness Tp of the pad 400. In detail, the thickness t3 of the pad metal layer 403 may be equal to or greater than about 60% or 70% of the total thickness Tp of the pad 400. The thickness t3 of the pad metal layer 403 may be about ten times thicknesses of other layers, for example, a thickness t1 of the pad auxiliary layer 401 or a thickness of the first pad protective layer 407. The thickness t3 of the pad metal layer 403 may range from about 3000 Å to about 15000 Å. For example, the thickness t3 of the pad metal layer 403 may be about 6000 Å.

The pad metal layer 403 may include Cu, Al, Pt, Pd, Ag, Mg, Au, Ni, Nd, Ir, Cr, Li, Ca, or Mo by considering the conductivity, etc. The pad metal layer 403 may be a layer or layers including the above materials. In detail, the pad metal layer 403 may include Cu and may be, for example, a single Cu layer.

The pad auxiliary layer 401 may be disposed on a lower surface of the pad metal layer 403 and increase adhesion between the pad 400 and a layer (e.g., the second insulating layer IL2) disposed under the pad 400.

The pad auxiliary layer 401 may include a different material from the pad metal layer 403. The pad auxiliary layer 401 may be a metal auxiliary layer including metal such as Ti by considering conductivity and adhesion. The pad auxiliary layer 401 may include Transparent Conductive Oxide (TCO) such as IZO, gallium zinc oxide (GZO), or zinc indium oxide (ZIO), and the TCO stated may be amorphous or crystalline.

The thickness t1 of the pad auxiliary layer 401 may be less than the thickness t3 of the pad metal layer 403. For example, the thickness t1 of the pad auxiliary layer 401 may range from about 10 Å to about 500 Å. In detail, the thickness t1 of the pad auxiliary layer 401 may be about 200 Å.

The pad auxiliary layer 401 and the pad metal layer 403 may be continuously formed, and thus, an upper surface of the pad auxiliary layer 401 may directly contact a lower surface of the pad metal layer 403. The pad auxiliary layer 401 may include Ti, and the pad metal layer 403 may include Cu, and when the pad auxiliary layer 401 and the pad metal layer 403 include different materials, an interface between the pad auxiliary layer 401 and the pad metal layer 403 may be checked on a cross-section of the pad 400.

The first pad protective layer 407 may be disposed on the pad metal layer 403. The first pad protective layer 407 may prevent damage to the pad metal layer 403 from an etching process included in the manufacturing processes of the display apparatus. For example, the first pad protective layer 407 may be disposed on the pad metal layer 403 to prevent the pad metal layer 403 from being damaged by an etchant used during a process of etching a pixel electrode of a light-emitting diode of the display apparatus.

The first pad protective layer 407 may include a conductive material, e.g., TCO, which may protect the pad metal layer 403. The first pad protective layer 407 may include ITO, IZO, ZnO, $In_2O_3$, IGO, or AZO. The first pad protective layer 407 may be a layer or layers including the above materials. For example, the first pad protective layer 407 may be a single p-ITO layer containing about 5 at % to about 15 at % of tin (Sn).

A thickness t7 of the first pad protective layer 407 may be less than the thickness t3 of the pad metal layer 403. For example, the thickness t7 of the first pad protective layer 407 may be from about 100 Å to about 1500 Å. In detail, the thickness t7 of the first pad protective layer 407 may be about 300 Å. The thickness t7 of the first pad protective layer 407 may be greater than a thickness t5 of the second pad protective layer 405. For example, the thickness t7 of the first pad protective layer 407 may be about five times the thickness t5 of the second pad protective layer 405. However, one or more embodiments are not limited thereto, and the thickness t5 of the second pad protective layer 405 may be greater than the thickness t7 of the first pad protective layer 407.

The second pad protective layer 405 may be interposed between the pad metal layer 403 and the first pad protective layer 407. When a pin hole is generated in the first pad protective layer 407, the second pad protective layer 405 may prevent an etchant from being introduced inside the pad 400 through the pin hole and contacting the pad metal layer 403. Because the first pad protective layer 407 prevents the pad metal layer 403 from being damaged, when the display apparatus does not include the second pad protective layer 405 and the thickness of the first pad protective layer 407 is reduced, the pad metal layer 403 may be damaged. However, the display apparatus 1 according to the present embodiment includes the second pad protective layer 405, and the second pad protective layer 405 prevents or decreases the damage to the pad metal layer 403, and thus, the thickness of the first pad protective layer 407 may decrease or may be minimized without the damage to the pad metal layer 403.

The second pad protective layer 405 may include a different material from the first pad protective layer 407. In detail, the second pad protective layer 405 may be a metal layer including metal such as Ti, Mo, or W. The second pad protective layer 405 may have a single-layer structure or a multilayered structure including the above metal. For example, the second pad protective layer 405 may have a single-layer structure such as a Ti layer, a Mo layer, or a W layer. Alternatively, the second pad protective layer 405 may have a multilayered structure in which the above layers are stacked.

The thickness t5 of the second pad protective layer 405 may be less than the thickness t3 of the pad metal layer 403. In detail, the thickness t5 of the second pad protective layer 405 may range from about 10 Å to about 1000 Å. For example, the thickness t5 of the second pad protective layer 405 may be about 240 Å. FIGS. 8 and 9 illustrate that the pad 400 has a four-layer structure including the pad auxiliary layer 401, the pad metal layer 403, the second pad protective layer 405, and the first pad protective layer 407, but one or more embodiments are not limited thereto.

Figure 10:
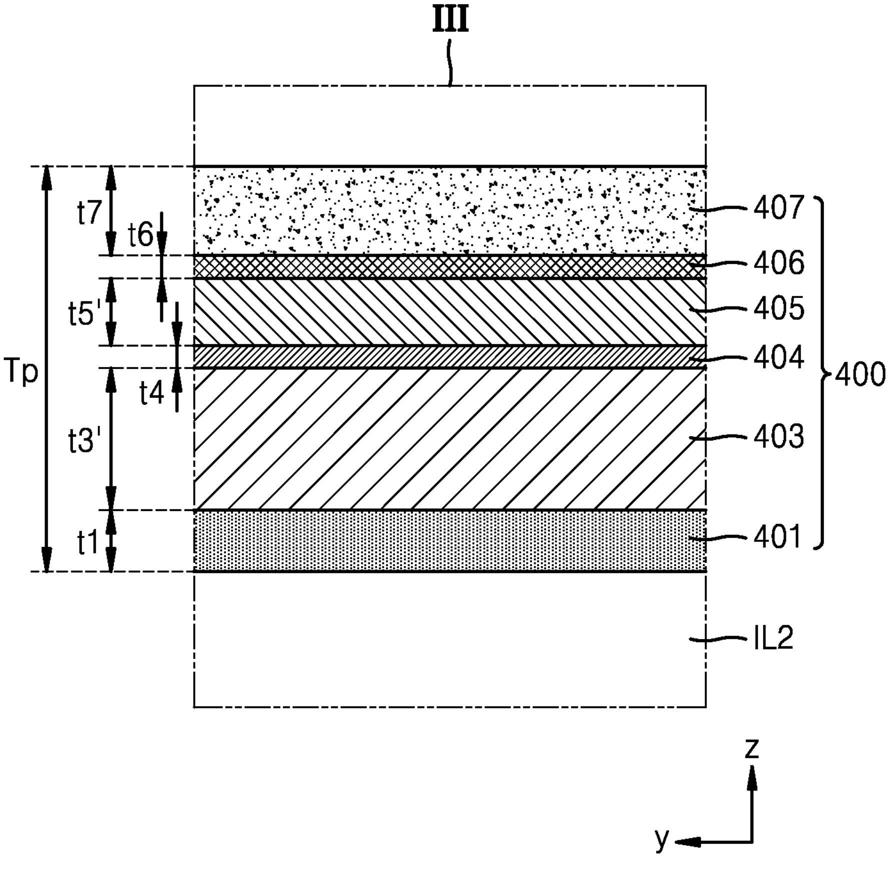
FIG. 10 is a schematic cross-sectional view of a portion of a display apparatus, according to an embodiment.

For example, as illustrated in FIG. 10 that is a schematic cross-sectional view of a portion of the display apparatus 1, the pad 400 may further include a first metal oxide layer 404 interposed between the pad metal layer 403 and the second pad protective layer 405. The first metal oxide layer 404 may include other metal elements that are different from metal elements included in the first pad protective layer 407. The first metal oxide layer 404 may include metal oxide including first metal, and the first metal may be a metal element included in the pad metal layer 403. For example, when the pad metal layer 403 includes Cu, the first metal oxide layer 404 may include copper oxide ($CuO_X$). A thickness t4 of the first metal oxide layer 404 may be less than about 50 Å. In this case, a thickness t3' of the pad metal layer 403 may be less than the thickness t3 described above with reference to FIG. 9.

Because the pad metal layer 403 and the first metal oxide layer 404 include the same metal element (e.g., the first metal), an interface of the pad metal layer 403 and the first metal oxide layer 404 may be identified using the oxygen content. For example, when components are analyzed in a direction (a +z direction) from the pad metal layer 403 to the first metal oxide layer 404, a section in which the oxygen content increases may correspond to the first metal oxide layer 404.

As illustrated in FIG. 10, the pad 400 may further include a second metal oxide layer 406 interposed between the second pad protective layer 405 and the first pad protective layer 407. The second metal oxide layer 406 may include metal oxide including second metal, and the second metal may be a metal element included in the second pad protective layer 405. For example, when the second pad protective layer 405 includes Ti, the second metal oxide layer 406 may include titanium oxide ($TiO_X$).

Because the second pad protective layer 405 and the second metal oxide layer 406 include the same metal element (e.g., the second metal), an interface of the second pad protective layer 405 and the second metal oxide layer 406 may be identified using oxygen content. When components are analyzed in a direction (the +z direction) from the second pad protective layer 405 to the second metal oxide layer 406, a section in which the oxygen content increases may correspond to the second metal oxide layer 406. A thickness t6 of the second metal oxide layer 406 may be less than about 100 Å. In this case, a thickness t5' of the second pad protective layer 405 may be less than the thickness t5 described above with reference to FIG. 9.

As illustrated in FIG. 8, the pad 400 may contact the connection wire 1100, for example, the second portion 1102 of the connection wire 1100, through a contact hole CNT formed in the second insulating layer IL2. A connection region, where the pad 400 is connected to the second portion 1102 of the connection wire 1100, may be covered by (or may overlap) the third insulating layer IL3 disposed on the pad 400. That is, the contact hole CNT for electrically connecting the pad 400 to the second portion 1102 of the connection wire 1100 may be covered by the third insulating layer IL3. In detail, the third insulating layer IL3 may cover edges of the pad 400 and the connection region where the pad 400 is connected to the second portion 1102 of the connection wire 1100. The third insulating layer IL3 may include a first hole IL3-H overlapping the pad 400.

The organic insulating layer OL may be disposed on the third insulating layer IL3 and may include a second hole OL-H overlapping the first hole IL3-H of the third insulating layer IL3. A width of the second hole OL-H of the organic insulating layer OL may be different from a width of the first hole IL3-H. For example, as illustrated in FIG. 8, the width of the second hole OL-H may be less than that of the first hole IL3-H.

An upper surface of the pad 400 may be exposed to the outside through the first hole IL3-H and the second hole OL-H. A printed circuit board or an integrated circuit device may be electrically connected to the pad 400 exposed through the first hole IL3-H and the second hole OL-H. FIG. 8 illustrates that the total thickness Tp of the pad 400 is relatively uniform, but one or more embodiments are not limited thereto.

Figure 11:
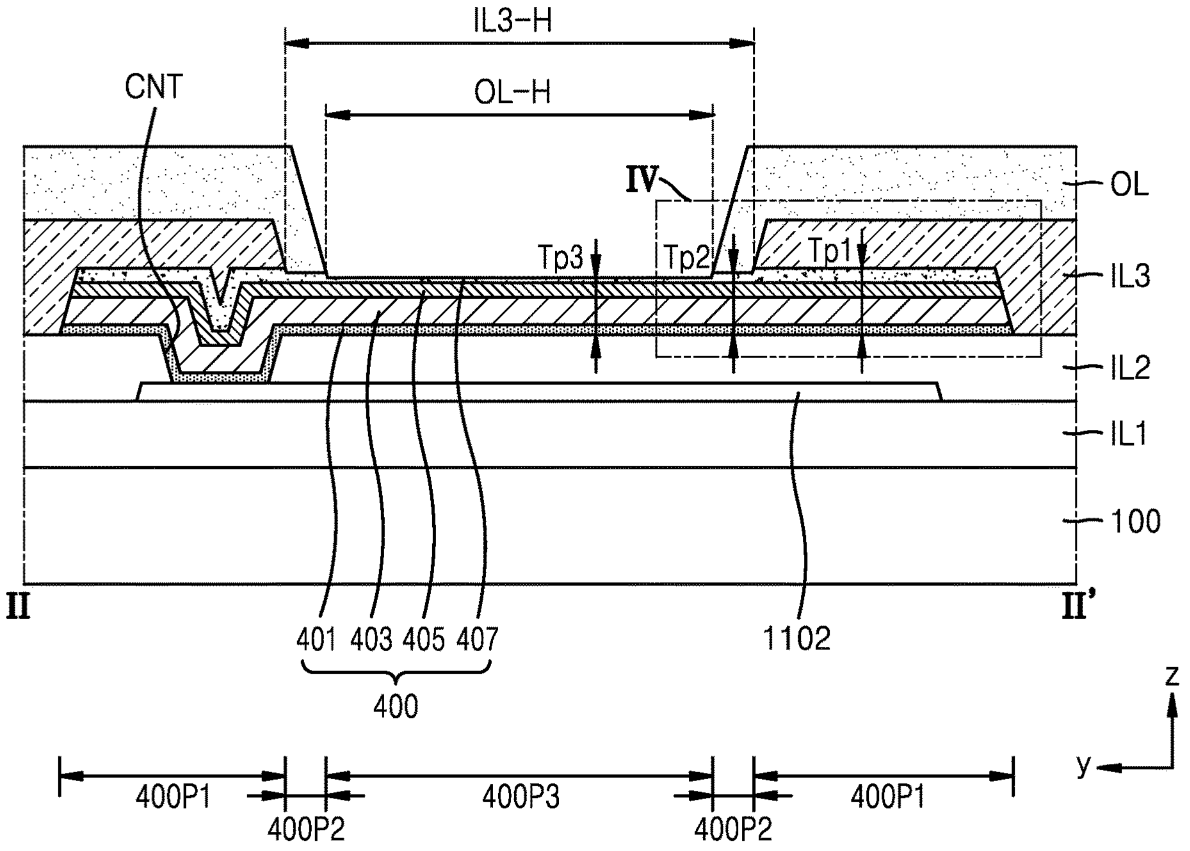
FIG. 11 is a schematic cross-sectional view of a portion of a display apparatus, according to an embodiment.
Figure 12:
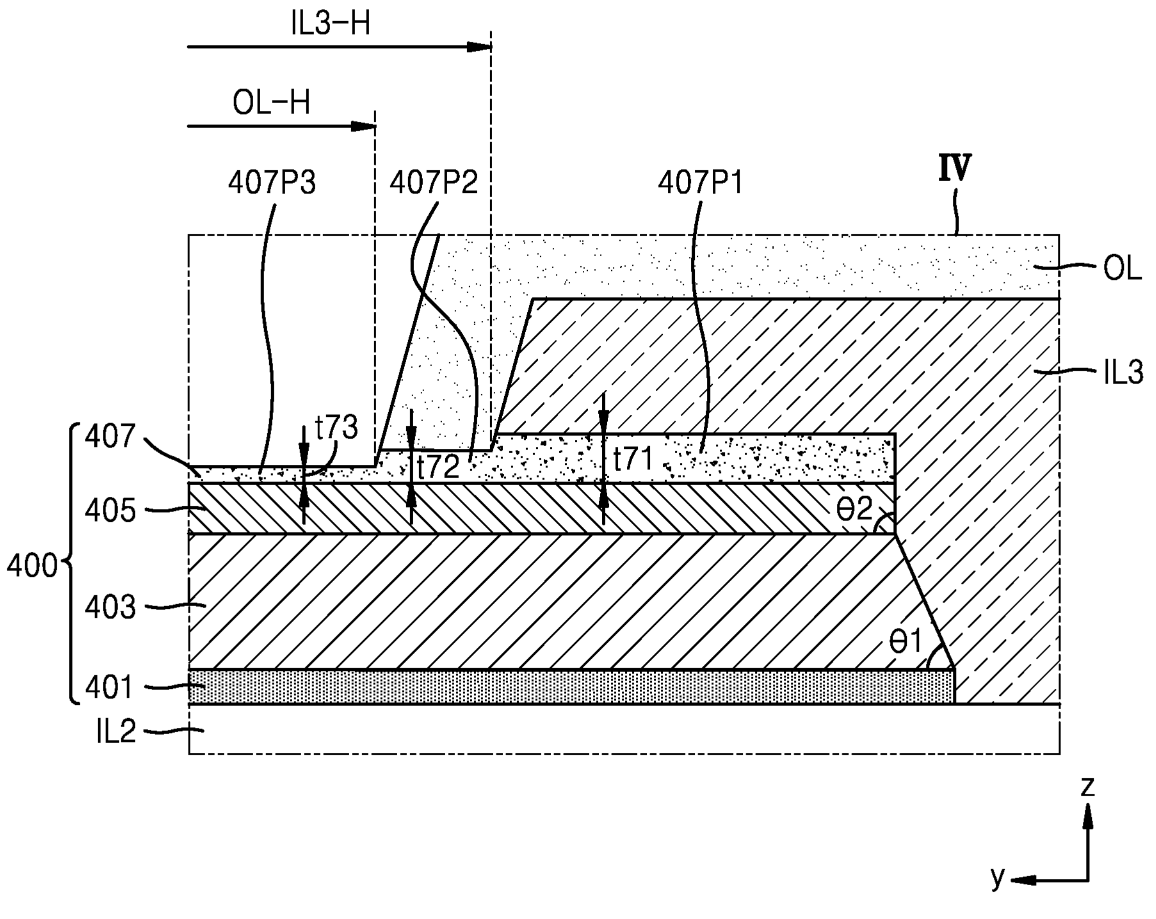
FIG. 12 is a cross-sectional view illustrating an enlarged region IV of FIG. 10.

For example, as illustrated in FIG. 11 that is a schematic cross-sectional view of a portion of the display apparatus 1, the thickness of the pad 400 may be different in regions. In detail, FIG. 11 is a cross-sectional view of the display apparatus taken along line II-II' of FIG. 3. FIG. 12 is a cross-sectional view illustrating an enlarged region IV of FIG. 10.

As illustrated in FIG. 11, the pad 400 may include a first pad portion 400P1, which is an edge portion of the pad 400, and a second pad portion, which is closer to the center of the pad 400 than the first pad portion 400P1. The second pad portion may include a 2-1 pad portion 400P2 and a 2-2 pad portion 400P3. The 2-1 pad portion 400P2 may be closer to the first pad portion 400P1 than the 2-2 pad portion 400P3.

The first pad portion 400P1 of the pad 400 may overlap the third insulating layer IL3 and the organic insulating layer OL. The 2-1 pad portion 400P2 may overlap the organic insulating layer OL. The 2-2 pad portion 400P3 may not overlap the third insulating layer IL3 and may not overlap the organic insulating layer OL. That is, the 2-2 pad portion 400P3 may simultaneously overlap the first hole IL3-H and the second hole OL-H, the 2-1 pad portion 400P2 may overlap the first hole IL3-H, and the first pad portion 400P1 may not overlap the first hole IL3-H and may not overlap the second hole OL-H.

A thickness Tp1 of the first pad portion 400P1 may be greater than a thickness Tp2 of the 2-1 pad portion 400P2, and the thickness Tp2 of the 2-1 pad portion 400P2 may be greater than a thickness Tp3 of the 2-2 pad portion 400P3. The thickness of each portion of the pad 400 may be affected by the thickness of the first pad protective layer 407.

As illustrated in FIG. 12, the first pad protective layer 407, which is an uppermost layer of the pad 400, may differ in each portion. The first pad protective layer 407 may include a first pad portion 407P1, a 2-1 pad portion 407P2, and a 2-2 pad portion 407P3 that respectively correspond to the first pad portion 400P1, the 2-1 pad portion 400P2, and the 2-2 pad portion 400P3 of the pad 400.

The first pad portion 407P1 of the first pad protective layer 407 may overlap the third insulating layer IL3 and the organic insulating layer OL. The 2-1 pad portion 407P2 of the first pad protective layer 407 may overlap any one of the third insulating layer IL3 and the organic insulating layer OL, for example, the organic insulating layer OL. The 2-2 pad portion 407P3 of the first pad protective layer 407 may not overlap the third insulating layer IL3 and the organic insulating layer OL. That is, the 2-2 pad portion 407P3 of the first pad protective layer 407 may simultaneously overlap the first hole IL3-H and the second hole OL-H, the 2-1 pad portion 407P2 of the first pad protective layer 407 may overlap any one of the first hole IL3-H and the second hole OL-H (e.g., the first hole IL3-H), and the first pad portion 407P1 of the first pad protective layer 407 may not overlap the first hole IL3-H and the second hole OL-H.

A thickness t71 of the first pad portion 407P1 of the first pad protective layer 407 may be identical to the thickness t7 described above with reference to FIG. 9. On the other hand, a thickness t72 of the 2-1 pad portion 407P2 of the first pad protective layer 407 may be less than the thickness t71 of the first pad portion 407P1. The first hole IL3-H of the third insulating layer IL3 may be formed through etching, and as the first pad protective layer 407 is partially lost during the etching process of forming the first hole IL3-H, the thickness t72 of the 2-1 pad portion 407P2 may be less than the thickness t71 of the first pad portion 407P1.

A thickness t73 of the 2-2 pad portion 407P3 of the first pad protective layer 407 may be less than the thickness t72 of the 2-1 pad portion 407P2 of the first pad protective layer 407. The 2-2 pad portion 407P3 of the first pad protective layer 407 may be primarily lost in the etching process of forming the first hole IL3-H and then secondarily lost in an etching process of forming the pixel electrode 510 of the display apparatus 1. Therefore, the thickness t73 of the 2-2 pad portion 407P3 may be less than the thickness t72 of the 2-1 pad portion 407P2 and the thickness t71 of the first pad portion 407P1.

As illustrated in FIG. 12, a side surface of the pad metal layer 403 may include a gradient that is tapered in a forward direction. Accordingly, the pad 400 having the multilayered structure may have an inclined surface tapered in the forward direction. When the pad 400 has the inclined surface tapered in the forward direction, the step coverage of the third insulating layer IL3 covering the edge of the pad 400 may be improved on the pad 400.

In detail, a side surface of the pad metal layer 403 may have a first tilt angle θ1. The first tilt angle θ1 may range from about 20 degrees to about 70 degrees. When the first tilt angle θ1 is less than about 20 degrees, an area of the upper surface of the pad 400 (in the +z direction) is greatly reduced. Accordingly, because the adhesion between the pad 400 and a layer disposed on the pad 400 is weak, the layer disposed on the pad 400 may be separated from the pad 400. When the first tilt angle θ1 is greater than about 70 degrees, the step coverage of the third insulating layer IL3 covering the edge of the pad 400 may degrade on the pad 400.

As illustrated in FIG. 12, a side surface of the second pad protective layer 405 may have a second tilt angle θ2 that is different from the first tilt angle θ1. The second tilt angle θ2 may range from about 50 degrees to about 100 degrees. In this case, the side surface of the first pad protective layer 407 may have the same tilt angle as the side surface of the second pad protective layer 405.

Figure 13:
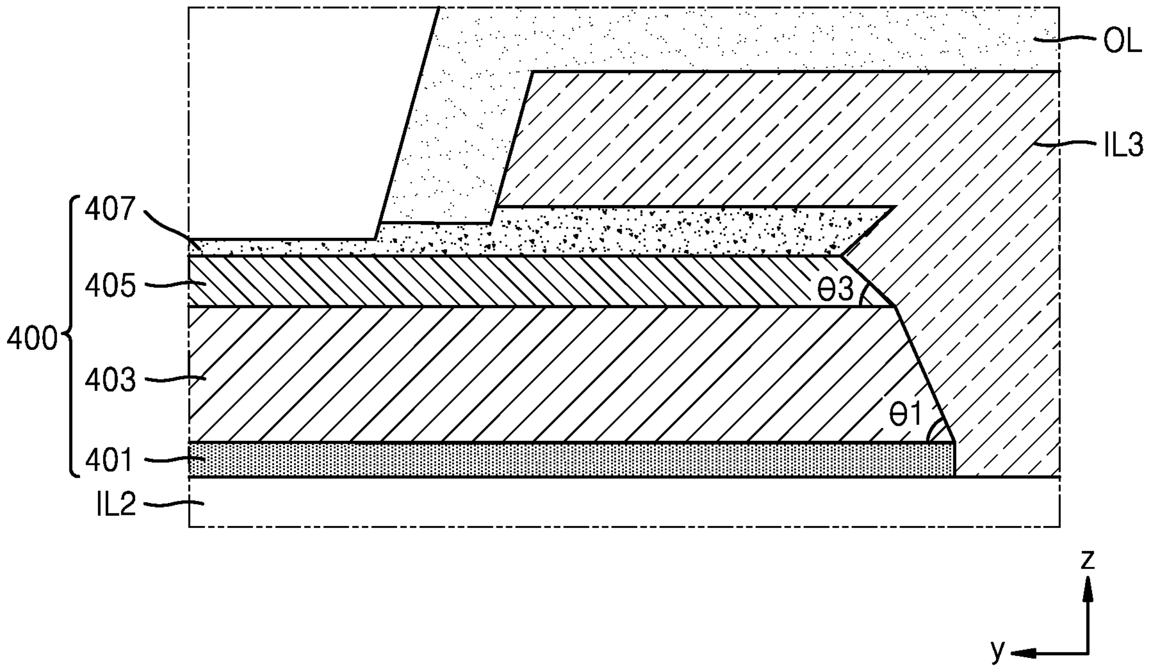
FIGS. 13 and 14 are cross-sectional views of a pad of a display apparatus according to a comparative example.
Figure 14:
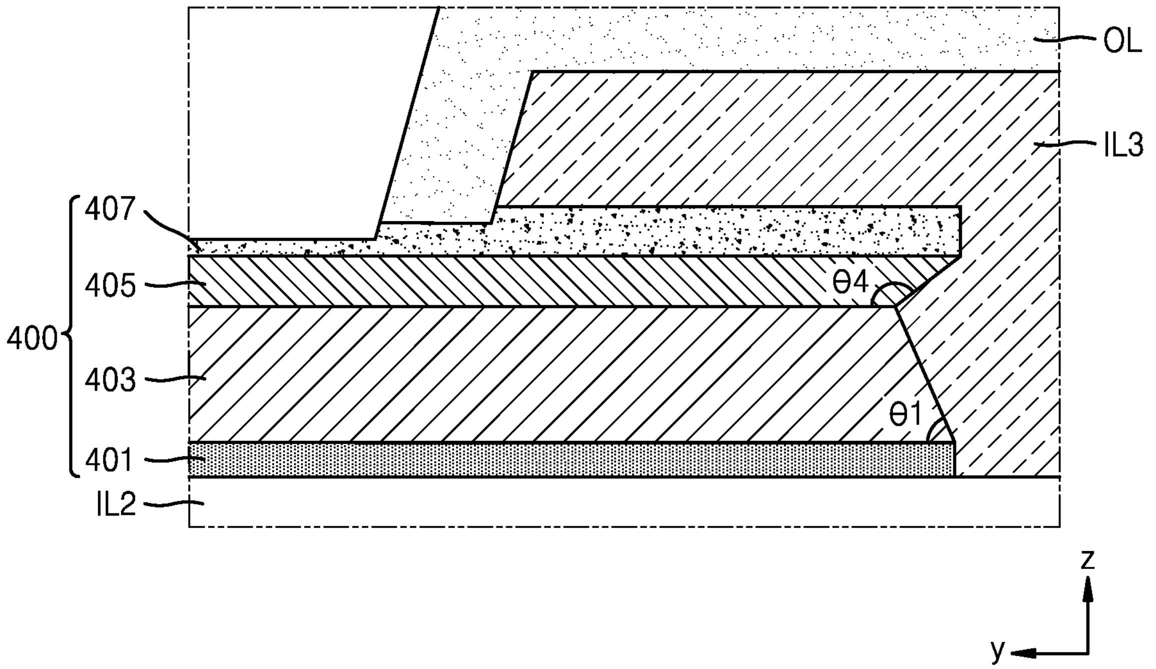

As illustrated in FIG. 13 that is a cross-sectional view for explaining a pad of a display apparatus according to a comparative example, when a tilt angle θ3 of the side surface of the second pad protective layer 405 is less than about 50 degrees, the side surface of the first pad protective layer 407 may include a gradient that is tapered in a reverse direction. Accordingly, the step coverage of the third insulating layer IL3 covering the edge of the pad 400 may degrade on the pad 400. As illustrated in FIG. 14 that is a cross-sectional view for explaining the pad of the display apparatus according to the comparative example, when a tilt angle θ4 of the side surface of the second pad protective layer 405 is greater than 100 degrees, the second pad protective layer 405 and the first pad protective layer 407 may include tips protruding further in a lateral direction than the pad metal layer 403. Accordingly, the step coverage of the third insulating layer IL3 that is an inorganic insulating layer may degrade.

However, in the case of the display apparatus 1 according to the present embodiment, the second tilt angle θ2 of the side surface of the second pad protective layer 405 may range from about 50 degrees to about 100 degrees. Therefore, the step coverage of the third insulating layer IL3 that is the inorganic insulating layer does not degrade.

Figure 15:
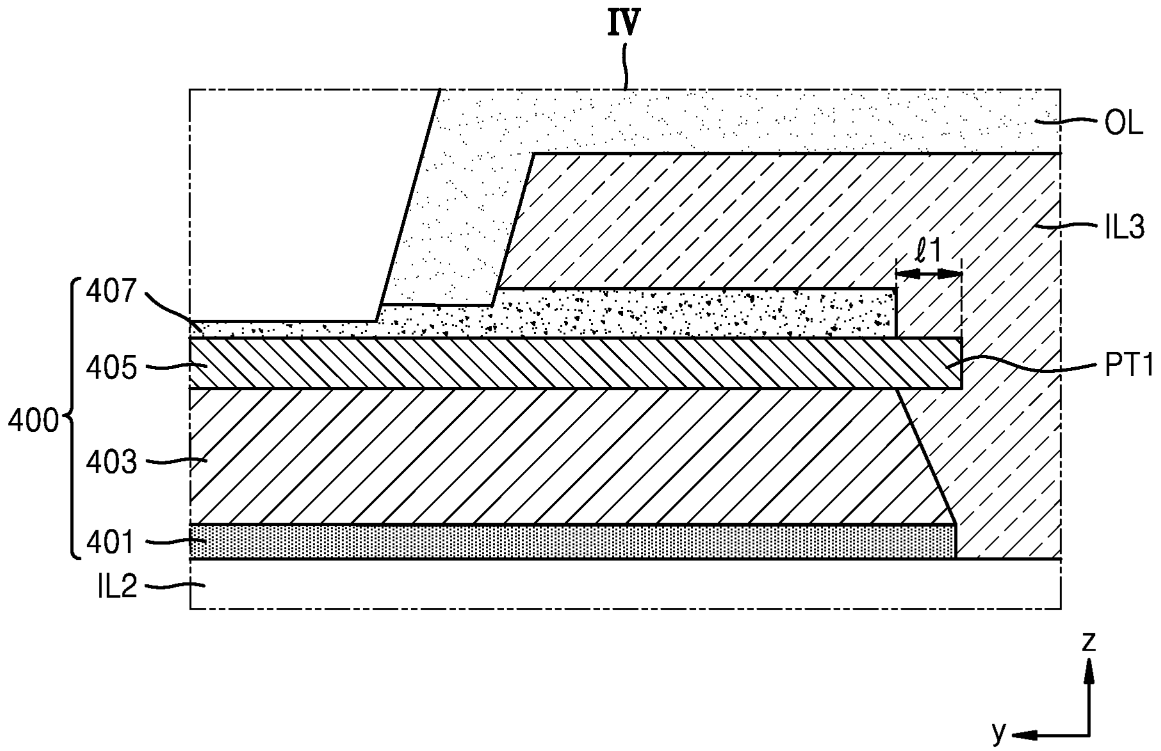
FIGS. 15, 16, and 17 are cross-sectional views of a pad of a display apparatus, according to an embodiment.
Figure 16:
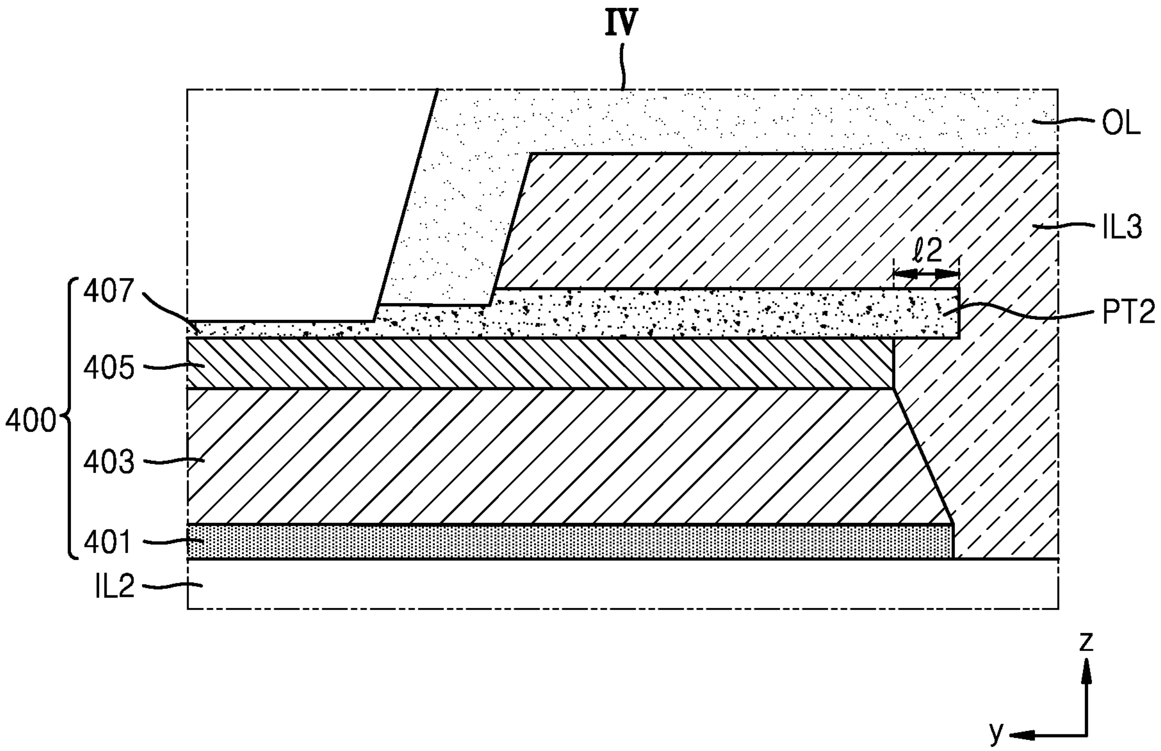

At least one of the layers included in the pad 400 may include a tip protruding further in the lateral direction than layers disposed adjacent to the pad 400. For example, as illustrated in FIG. 15 that is a cross-sectional view for explaining the pad 400 of the display apparatus 1 according to an embodiment, the second pad protective layer 405 may protrude further than the pad metal layer 403 and the first pad protective layer 407 in a lateral direction (a −y direction) and thus form a first tip PT1. Alternatively, as illustrated in FIG. 16 that is a cross-sectional view for explaining the pad 400 of the display apparatus 1 according to an embodiment, the first pad protective layer 407 may protrude further than the pad metal layer 403 or the second pad protective layer 405 in the lateral direction (the −y direction) and thus form a second tip PT2.

Lengths 11, 12 of the first tip PT1 and the second tip PT2 may each be less than about 0.1 μm. When the lengths 11, 12 of the first tip PT1 and the second tip PT2 are greater than about 0.1 μm, the step coverage of the third insulating layer IL3 that is the inorganic insulating layer may degrade.

Figure 17:
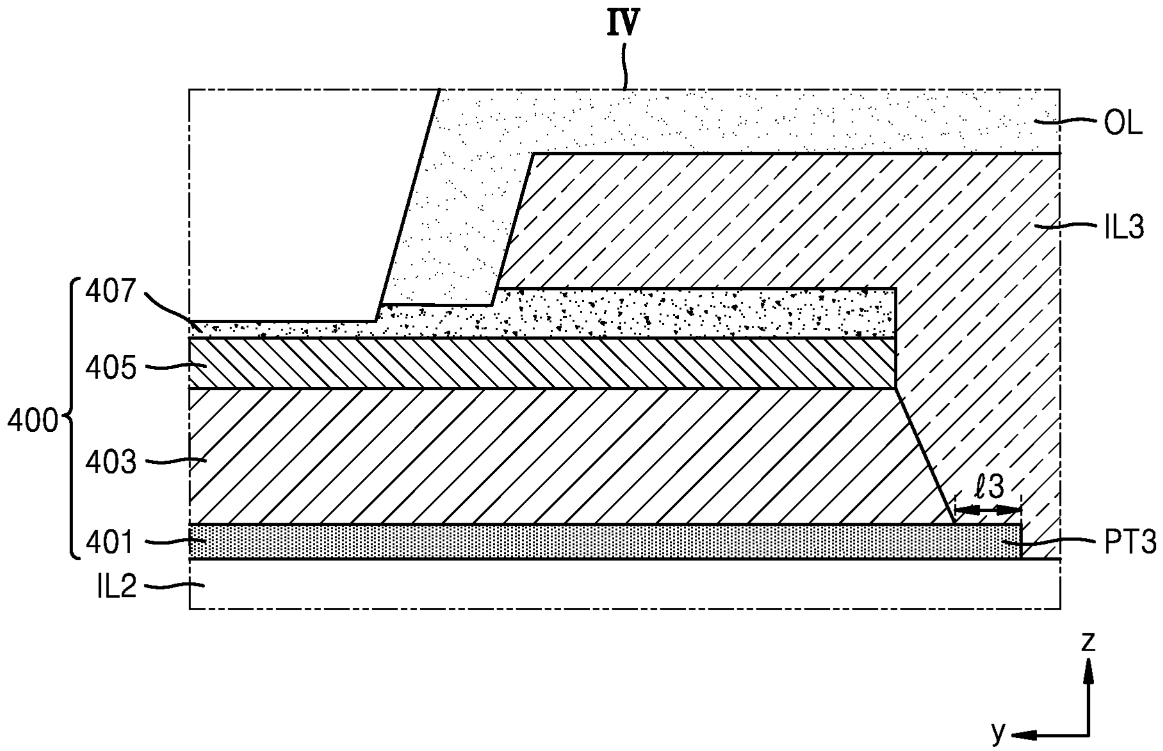

For example, as illustrated in FIG. 17 that is a cross-sectional view for explaining the pad 400 of the display apparatus 1 according to an embodiment, the pad auxiliary layer 401 may protrude further than the pad metal layer 403 in the lateral direction (the −y direction) and thus form a third tip PT3. A length 13 of the third tip PT3 may be less than about 0.2 μm. When the length 13 of the third tip PT3 is greater than about 0.2 μm, an area occupied by one pad 400 may incredibly increase, and thus, gaps between the pads 400 or gaps between the pads 400 and wires arranged adjacent to the pads 400 may be greatly narrowed. However, in the case of the display apparatus 1 according to the present embodiment, the length 13 of the third tip PT3 of the pad auxiliary layer 401 is set to be less than about 0.2 μm. Therefore, because the area occupied by one pad 400 is small, the space may be effectively used.

Figure 18:
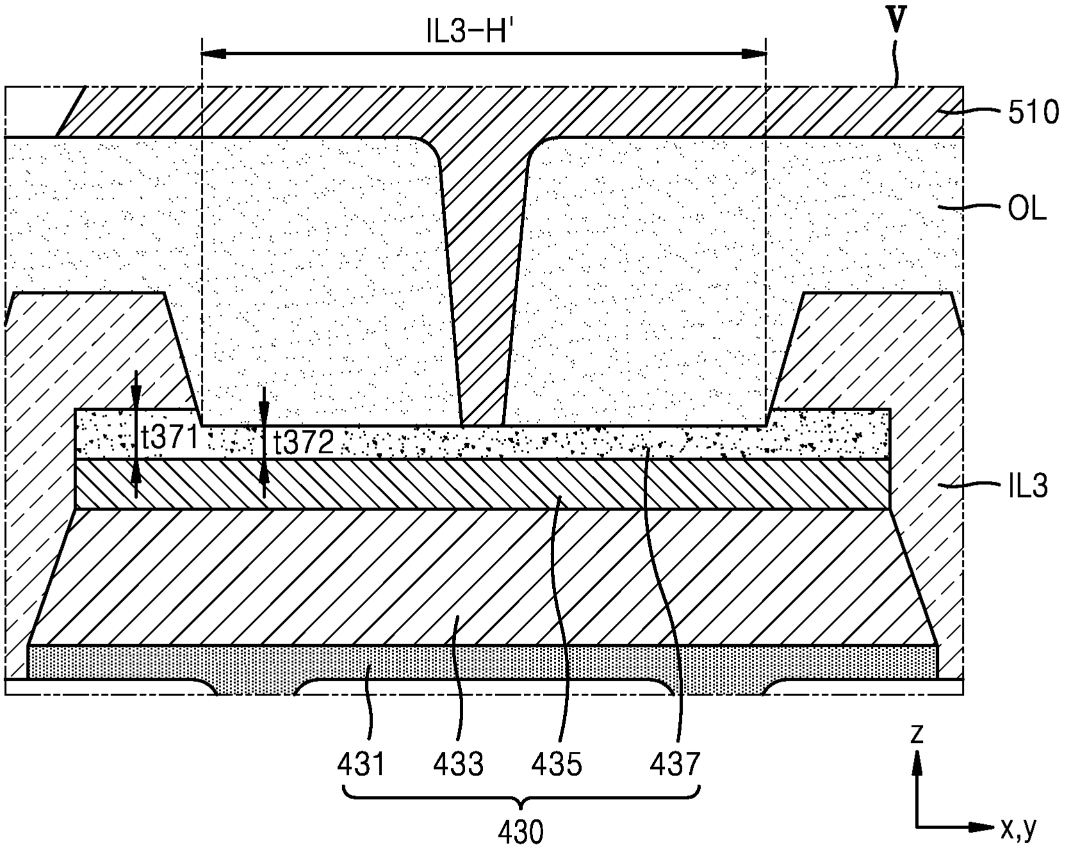
FIG. 18 is a cross-sectional view illustrating an enlarged region V of FIG. 4.

FIG. 18 is a cross-sectional view of an enlarged region V of FIG. 4. As described above with reference to FIGS. 5 to 7, an electrode of the transistor TFT, for example, the first connection electrode 430, may include the sub-layers 431, 433, 435, and 437. For example, the first connection electrode 430 may include the connection metal layer 433, the connection auxiliary layer 431 disposed under the connection metal layer 433, the first connection protective layer 437 disposed on the connection metal layer 433, and the second connection protective layer 435 interposed between the connection metal layer 433 and the first connection protective layer 437. The first connection electrode 430 may also include layers respectively corresponding to the first metal oxide layer 404 and the second metal oxide layer 406 of the pad 400.

As described above with reference to FIGS. 5 to 7, because the first connection electrode 430, etc. are formed through the same process as the pad 400, the sub-layers 431, 433, 435, and 437 of the first connection electrode 430 may include the same materials as the sub-layers included in the pad 400. For example, the connection metal layer 433 of the first connection electrode 430 may include the same material as the pad metal layer 403 of the pad 400. The connection auxiliary layer 431, the second connection protective layer 435, and the first connection protective layer 437 of the first connection electrode 430 may include the same materials as the pad auxiliary layer 401, the second pad protective layer 405, and the first pad protective layer 407 of the pad 400, respectively.

The thickness of each of the connection auxiliary layer 431, the connection metal layer 433, and the second connection protective layer 435 may be substantially the same as the thickness of each of the pad auxiliary layer 401, the pad metal layer 403, and the second pad protective layer 405. The first connection protective layer 437 of the first connection electrode 430 may have different thicknesses in respective portions, but the thickness of the first connection protective layer 437 may be different from that of the first pad protective layer 407 of the pad 400.

The first connection protective layer 437 may include a first connection portion, which is an edge portion of the first connection protective layer 437, and a second connection portion, which is an inner portion of the first connection protective layer 437. In detail, the first connection portion may overlap the third insulating layer IL3, and the second connection portion may overlap a third hole IL3-H' of the third insulating layer IL3. The third hole IL3-H' is configured to connect the transistor TFT to the pixel electrode 510 and overlaps the first connection electrode 430.

A thickness t371 of the first connection portion may be greater than a thickness t372 of the second connection portion. Some materials corresponding to the second connection portion may be lost while the third hole IL3-H' is formed, and thus, the thickness t372 of the second connection portion may be less than the thickness t371 of the first connection portion.

As described above with reference to FIG. 12, the first pad protective layer 407 has step differences in three portions having different thicknesses, but the first connection protective layer 437 may have step differences in two portions having different thicknesses. The thickness t372 of the second connection portion may be greater than the thickness t73 of the 2-2 pad portion 407P3 of the first pad protective layer 407. As described above, some materials corresponding to the second connection portion may be lost in the process of forming the third hole IL3-H', but the 2-2 pad portion 407P3 of the first pad protective layer 407 may be primarily lost in the process of forming the first hole IL3-H and secondarily lost in the process of forming the pixel electrode 510 of the display apparatus 1. Thus, the thickness t372 of the second connection portion may be greater than the thickness t73 of the 2-2 pad portion 407P3 of the first pad protective layer 407.

Unlike the first connection electrode 430, an upper surface of the second connection electrode 440 and an upper surface of the second electrode 420 of the storage capacitor Cst may be covered by the third insulating layer IL3. In this case, an uppermost layer of the second connection electrode 440 and an uppermost layer of the second electrode 420 may have relatively uniform thicknesses regardless of regions.

FIG. 18 illustrates that some thicknesses of the sub-layers of the first connection electrode 430 are different in respective portions, but one or more embodiments are not limited thereto. For example, the second connection electrode 440 may be connected to the pixel electrode 510, and in this case, the second connection electrode 440 may have the sub-layers that have different thicknesses in respective portions.

According to the one or more embodiments, a display apparatus in which the occurrence of defects during the manufacture of the display apparatus is reduced, and a method of manufacturing the display apparatus are provided. The scope of the disclosure is not limited by the effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the following claims.

What is claimed is:

1. A display apparatus comprising:

a substrate comprising a display area and a peripheral area outside the display area;

a display element disposed on the display area;

a transistor electrically connected to the display element; and a pad disposed on the peripheral area and having a multilayered structure, wherein the pad comprises:

a pad metal layer;

a first pad protective layer disposed on the pad metal layer;

a second pad protective layer interposed between the pad metal layer and the first pad protective layer and comprising a different material from the first pad protective layer; and an inorganic insulating layer covering an edge of the pad and comprising a first hole overlapping the pad, wherein the transistor comprises:

a semiconductor layer disposed on the substrate;

a gate electrode disposed on a gate insulating layer that covers the semiconductor layer; and a connection electrode disposed on an interlayer insulating layer covering the gate electrode, having a same multilayered structure as the multilayered structure of the pad, and connected to the semiconductor layer, wherein the first pad protective layer comprises a first pad portion overlapping the inorganic insulating layer, and a second pad portion overlapping the first hole of the inorganic insulating layer, wherein the second pad portion extends across the first hole of the inorganic insulating layer to an edge of the first hole of the inorganic insulating layer, wherein a thickness of the first pad portion is greater than a thickness of the second pad portion, and wherein the first pad portion extends to the edge of the first hole of the inorganic insulating layer.

2. The display apparatus of claim 1, wherein a tilt angle of a side surface of the pad metal layer ranges from about 20 degrees to about 70 degrees.

3. The display apparatus of claim 1, wherein a tilt angle of a side surface of the second pad protective layer ranges from about 50 degrees to about 100 degrees.

4. The display apparatus of claim 1, wherein the pad further comprises a first metal oxide layer interposed between the pad metal layer and the second pad protective layer and comprising a same metal element as metal in the pad metal layer.

5. The display apparatus of claim 1, wherein the pad further comprises a second metal oxide layer interposed between the second pad protective layer and the first pad protective layer and comprising a same metal element as metal in the second pad protective layer.

6. The display apparatus of claim 1, wherein the connection electrode comprises:

a connection metal layer;

a first connection protective layer disposed on the connection metal layer; and a second connection protective layer interposed between the connection metal layer and the first connection protective layer and comprising a different material from the first connection protective layer.

7. The display apparatus of claim 6, wherein the connection metal layer comprises a same material as the pad metal layer, the first connection protective layer comprises a same material as the first pad protective layer, and the second connection protective layer comprises a same material as the second pad protective layer.

8. The display apparatus of claim 1, wherein the first pad protective layer comprises transparent conductive oxide, and the second pad protective layer comprises metal.

9. The display apparatus of claim 8, wherein the first pad protective layer comprises indium tin oxide (ITO), indium zinc oxide (IZO), zinc oxide (ZnO), indium oxide ($In_2O_3$), indium gallium oxide (IGO), or aluminum zinc oxide (AZO), and the second pad protective layer comprises titanium (Ti), molybdenum (Mo), or tungsten (W).

10. The display apparatus of claim 1, wherein the first pad protective layer or the second pad protective layer comprises a tip protruding further than the pad metal layer in a lateral direction.

11. The display apparatus of claim 10, wherein a length of the tip is less than about 0.1 μm with respect to one side of the pad metal layer.

12. The display apparatus of claim 1, further comprising an organic insulating layer disposed on the inorganic insulating layer and comprising a second hole overlapping the first hole of the inorganic insulating layer, wherein the second pad portion comprises a 2-1 pad portion relatively close to the first pad portion and a 2-2 pad portion that is relatively further from the first portion than the 2-1 pad portion, and a thickness of the 2-1 pad portion is greater than a thickness of the 2-2 pad portion.

13. The display apparatus of claim 12, wherein the connection electrode comprises:

a connection metal layer;

a first connection protective layer disposed on the connection metal layer; and a second connection protective layer interposed between the connection metal layer and the first connection protective layer and comprising a different material from the first connection protective layer, wherein the inorganic insulating layer covers the connection electrode and comprises a third hole overlapping the connection electrode, the first connection protective layer further comprises a first connection portion overlapping the inorganic insulating layer and a second connection portion overlapping the third hole, a thickness of the first connection portion is greater than a thickness of the second connection portion, and the thickness of the second connection portion is greater than a thickness of the 2-2 pad portion.

14. The display apparatus of claim 1, further comprising a pad auxiliary layer disposed under the pad metal layer.

15. The display apparatus of claim 14, wherein the pad auxiliary layer comprises a pad auxiliary layer tip protruding further than the pad metal layer in a lateral direction.

16. The display apparatus of claim 15, wherein a length of the pad auxiliary layer tip is less than about 0.2 μm with respect to one side of the pad metal layer.

* * * * *